United States Patent [19]
Singh

[11] Patent Number: 5,265,044
[45] Date of Patent: Nov. 23, 1993

[54] HIGH SPEED ARITHMETIC AND LOGIC GENERATOR WITH REDUCED COMPLEXITY USING NEGATIVE RESISTANCE

[76] Inventor: Tejinder Singh, 1235 Wildwood Ave. #25, Sunnyvale, Calif. 94089

[21] Appl. No.: 595,390

[22] Filed: Oct. 10, 1990

Related U.S. Application Data

[63] Continuation-in-part of Ser. No. 452,167, Dec. 15, 1989, abandoned.

[51] Int. Cl.⁵ .............................. G06F 7/50
[52] U.S. Cl. ..................... 364/784; 307/464
[58] Field of Search ................. 364/784–787, 364/716; 307/441, 445, 448, 450, 451, 454, 464

[56] References Cited

U.S. PATENT DOCUMENTS

| | | | |
|---|---|---|---|
| 3,113,206 | 12/1963 | Harel | 307/464 |
| 3,155,839 | 11/1964 | Modiano | 307/464 |
| 3,609,329 | 5/1969 | Martin | 307/464 X |
| 4,423,339 | 12/1983 | Seelbach et al. | 307/464 |
| 4,787,047 | 11/1988 | Wei | 364/716 |

*Primary Examiner*—Tan V. Mai
*Attorney, Agent, or Firm*—Flehr, Hohbach, Test, Albritton & Herbert

[57] ABSTRACT

A technique for generating a carry, AND, OR, NAND, NOR, INVERTING logic and sum and carry: operation in a one or at most two device delay by employing negative differential resistance devices. Circuits implemented with this technique are not only extremely fast, but use a small number of active devices as well. This technique could be implemented in building circuits using any transistor Bipolar Transistors, Field Effect Transistors (FETs), High Electron Mobility Transistors (HEMTs), Hetero-junction Bipolar Transistors (HBTs), etc. The negative differential resistance characteristics of the resonant tunneling transistor can be exploited to increase the noise margin. Resonant tunneling devices have the added advantage of working at very high speeds, and could yield propagation delays less than 5ps.

43 Claims, 26 Drawing Sheets

| INPUTS | | | OUTPUT | | | | | | | |
|---|---|---|---|---|---|---|---|---|---|---|
| x | y | C in | NOR | NAND | $\overline{C_{out}}$ | Operating Point on Curve of Fig. 5 | OR | AND | Cout | Operating Point on Curve of Fig. 13 |
| 0 | 0 | 0 | 1 | 1 | 1 | (d) | 0 | 0 | 0 | (d) |
| 0 | 0 | 1 | 0 | 1 | 1 | (c) | 1 | 0 | 0 | (c) |
| 0 | 1 | 0 | 0 | 1 | 1 | (c) | 1 | 0 | 0 | (c) |
| 0 | 1 | 1 | 0 | 1 | 0 | (b) | 1 | 0 | 1 | (b) |
| 1 | 0 | 0 | 0 | 1 | 1 | (c) | 1 | 0 | 0 | (c) |
| 1 | 0 | 1 | 0 | 1 | 0 | (b) | 1 | 0 | 1 | (b) |
| 1 | 1 | 0 | 0 | 1 | 0 | (b) | 1 | 0 | 1 | (b) |
| 1 | 1 | 1 | 0 | 0 | 0 | (a) | 1 | 1 | 1 | (a) |

Fig. 25.

| Xi | yi | Ci-1 | $\overline{C_{out}}$ | $\overline{C_{out}}$ | Cout | Sum | Curve |
|---|---|---|---|---|---|---|---|
| 0 | 0 | 0 | 1 | 1 | 0 | 0 | (d) |
| 0 | 0 | 1 | 1 | 1 | 0 | 1 | (c) |
| 0 | 1 | 0 | 1 | 1 | 0 | 1 | (c) |
| 1 | 0 | 0 | 1 | 1 | 0 | 1 | (c) |
| 1 | 0 | 1 | 0 | 0 | 1 | 0 | (b) |
| 1 | 1 | 0 | 0 | 0 | 1 | 0 | (b) |
| 0 | 1 | 1 | 0 | 0 | 1 | 0 | (b) |
| 1 | 1 | 1 | 0 | 0 | 1 | 1 | (a) |

Fig. 26.

HIGH SPEED ARITHMETIC AND LOGIC GENERATOR WITH REDUCED COMPLEXITY USING NEGATIVE RESISTANCE

CROSS-REFERENCE TO RELATED APPLICATION

This is a continuation in part of my prior application Ser. No. 452,167, filed Dec. 15, 1989.

BACKGROUND OF THE INVENTION

1. Field of the Invention

The invention relates to methods and apparatus for generating logic outputs corresponding to several inputs, and more specifically to methods and apparatus for generating CARRY, SUM, AND, OR, INVERTING, NAND and NOR logic outputs.

2. Description of the Prior Art

Quantum devices like resonant tunneling transistors (RTT) have some distinctive speed advantages over conventional transistors. As functional densities of devices increase, there is an increasing pressure to reduce the device sizes. Quantum effects pose a major problem in shrinking conventional devices. As the devices become smaller and smaller, quantum interference occurs naturally and cannot be avoided. Quantum devices like resonant tunneling transistors (RTT) in fact make use of the quantum effects to operate. The quantum effects however cause negative differential resistance (NDR) characteristics. In the past NDR devices have not been found to be suitable for digital applications. Thus, it is desirable to make use of NDR device for digital applications. It is further desirable to develop a structure which is suitable to microminiaturize the NDR device.

Regularity and simplicity are the major features desired for Ultra Large Scale Integration (ULSI). AND, OR, NAND, NOR, CARRY, SUM and INVERTING logical circuits are the basic cells in all circuit designs. The conventional logic elements or cells are not regular which makes autorouting and ULSI very difficult.

One of the desired features of logical circuits is fast speed without increasing the complexity. It is desired to achieve logic and fundamental arithmetic operations at a fast speed while reducing the complexity.

Simplicity and fast speed have special application on binary addition which is a basic operation performed by all Logic and Arithmetic Operation Units.

Let $x_i$ and $y_i$ be binary inputs of bit i, $z_i$ is the sum of the bit i and $c_i$ is the carry out of the bit i, then $z_i$ and $c_i$ can be defined as follows:

$$Z_i = X_i + Y_i + C_{i-1}$$

$$C_i = X_iY_i + X_iC_{i-1} + Y_iC_{i-1}$$

The above equations indicate that sum $z_i$ of the ith bit depends on the i-1th bit carry out $c_{i-1}$. If an adder has 64 bits and all $C_i (i=0, 1, 2, \ldots, 63)$ ripple through all 63 stages, the $c_{63}$ can be generated after 63 stages of delay which will slow the speed of the result of addition. Currently the carry look-ahead technique is the most common approach for achieving faster addition. In this strategy, the input carry bit of stage i is directly generated from the inputs of the preceding stages $i-1, i-2, \ldots, i-m$. An eight-bit carry look-ahead adder is shown in FIG 1. The carries can be expressed in terms of the propagate $P_i = x_i - y_i$ and generate ($g_i = \cdot y_i$) terms as $$c_i = g_i + p_ic_{i-1}.$$

This can be solved recursively for the carries and, for example, in an eight bit adder the final carry out is:

$$C_{out} = g_7 + p_7g_6 + p_7p_6g_5 + p_7p_6g_4 + p_7p_6p_5g_3 + p_7p_6p_5p_4g_2 + p_7p_6p_5p_4p_3g_1 + p_7p_6p_5p_4p_3p_2g_0 + p_7p_6p_5p_4p_3p_2p_1p_0c_{in}.$$

The complexity of the carry expressions increase as the number of look-ahead stages increases. This results in an increase in the fan-in requirements. The fan-in limitations thus limit the number of carry look-ahead stages to about $m \leq 8$.

To perform a 64-bit addition, eight such 8-bit carry look-ahead adders may be used as shown in FIG. 2. A carry look-ahead addition is performed on each group of eight adjacent bits, and the output carry bit of each group is transferred to the input of its left neighbor. There is thus a ripple carry propagation between groups. To reduce the carry propagation delay, carry look-ahead addition is implemented using tree circuits which may consist of either standard gates with limited fan-in and fan-out, or carry look-ahead modules with a limited number of terminals. Though the speed is marginally increased in such implementations, the number of active devices and the complexity of the circuit increases substantially.

The adder circuit described in U.S. Pat. No. 3,280,316 is designed using the conventional equations for the sum and carry. As a result the circuit is very complex (refer to FIG. 9 of the patent). The carry generation will require at least six device (resonant tunneling diode, RTD) delays.

SUMMARY OF THE INVENTION

Accordingly, it is an objective of the present invention to provide methods and apparatus which can effectively use the devices with Negative Differential Resistance characteristics for digital applications.

It is another objective of the present invention to provide methods and a structure of the apparatus which is suitable to microminiaturize for ULSI.

It is another objective of the present invention to provide methods and apparatus which can generate logic outputs including NAND, NOR, AND, OR, CARRY, SUM and INVERTING at extremely high speed with reduced complexity.

It is yet another objective of the present invention to provide methods and a structure of apparatus which are suitable to regularize logic circuits for autorouting for ULSI and fabrication.

The above features are achieved in the present invention by using controllable devices in active region. In response to a specific number of logical inputs, the same number of controllable devices are used. Each of the controllable device has a control terminal which receives one of the logical input and an output terminal which generates an output in response to the logical input at the control terminal. Each controllable device also has an I-V curve at the output terminal in response to variation of voltage at the input terminal. All the output terminals are parallely connected to a resistance device which determines a load line for all the controllable device. The connecting point (referred as common output terminal hereinafter) has different I-V curves in response to different input patterns at the input terminals. It is the combination of the I-V curves and the load line that determines a voltage level and hence logic level at the common output terminal.

This principle can be applied to resonant tunneling transistor, field effect transistor, bipolar junction transistor and to other negative resistance devices for generating CARRY, AND, OR, NAND, NOR, INVERT and SUM.

BRIEF DESCRIPTION OF THE DRAWINGS

FIG. 25 shows the relationship between the input and output logic levels, the logic operation and operating point; and FIG. 26 shows the relationship between the inputs, outputs and operating point to obtain the sum.

DETAILED DESCRIPTION OF PREFERRED EMBODIMENTS

Figure 1:
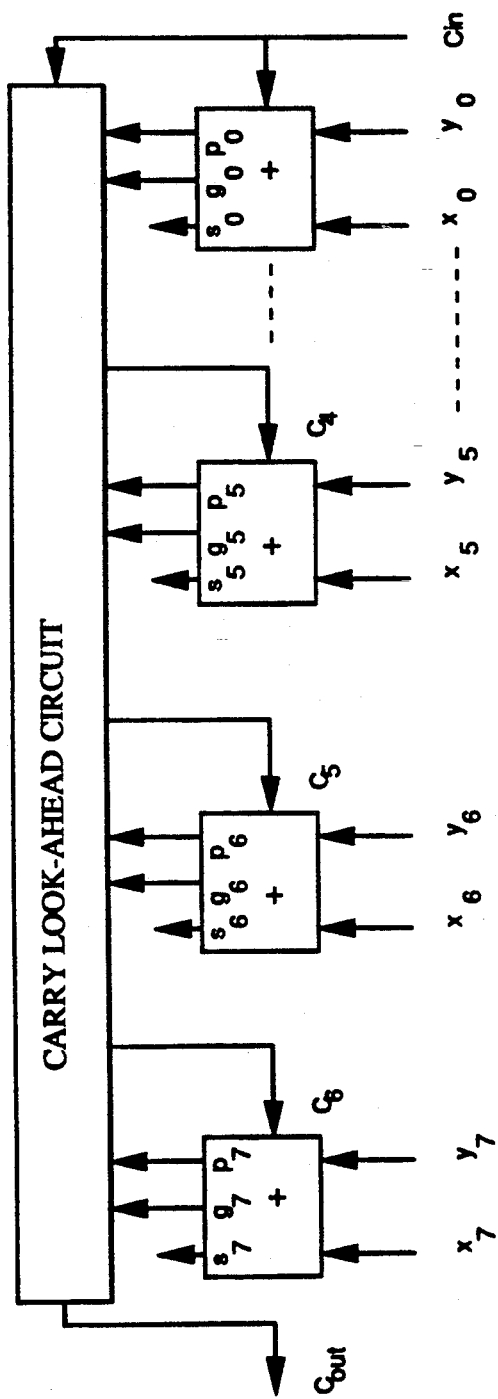
FIG. 1 is block diagram of an eight bit carry look-ahead adder (prior art)
Figure 2:
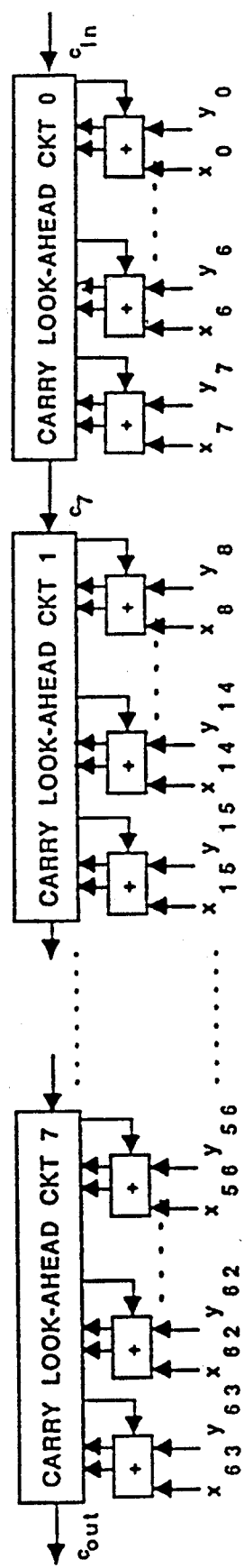
FIG. 2 is a 64 bit adder with 8 bit carry look-ahead (prior art)
Figure 3A:
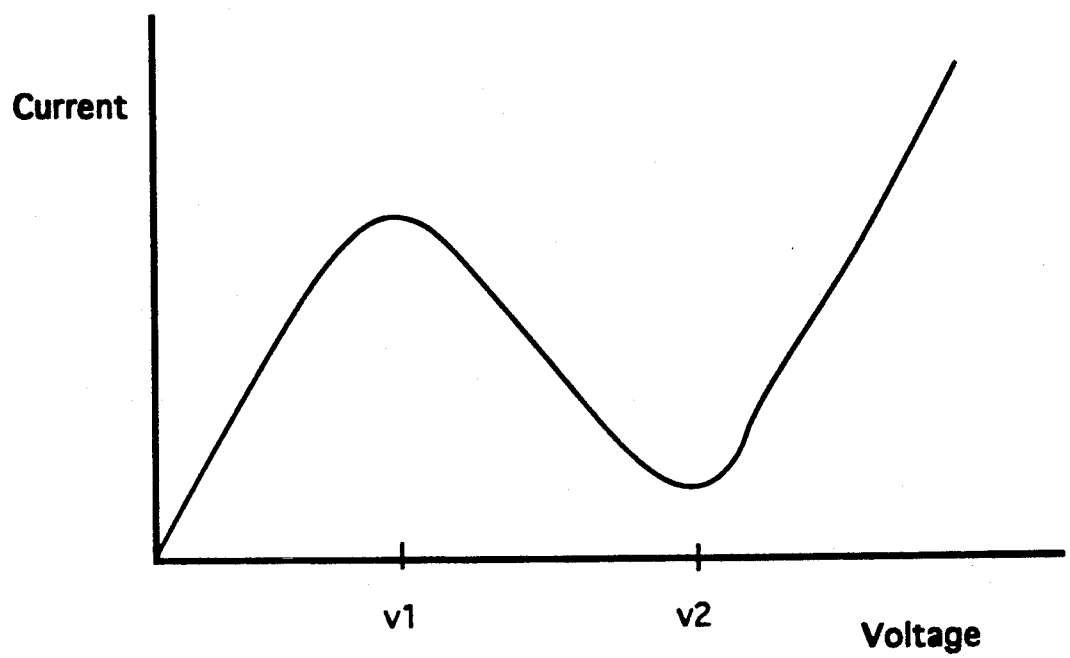
FIG. 3(a) illustrates the Negative Differential Resistance characteristics.
Figure 3B:
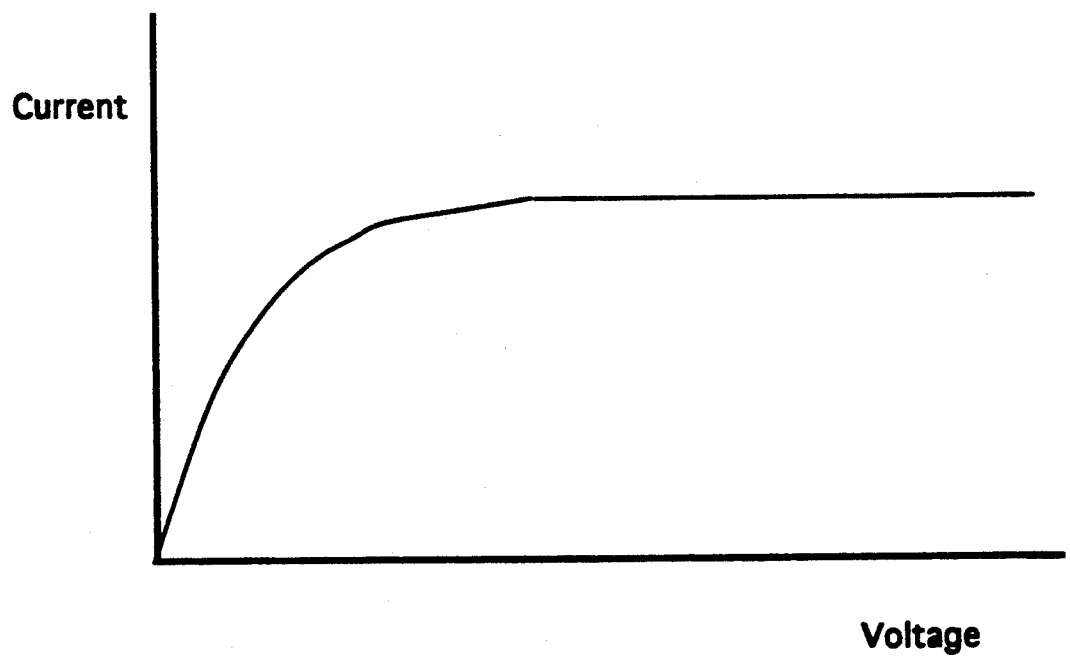
FIG. 3(b) illustrates the I-V characteristics for conventional transistors.

FIG. 3 (a) is an I-V curve for a resonant tunneling transistor illustrating the negative differential resistance (NDR) characteristics. For a particular voltage range (v1 to v2 as in FIG. 3(a)), over which, as the voltage applied increases, the current decreases, the device is said to exhibit NDR. The non-linear I-V characteristics for bipolar junction transistors and field effect transistors are as shown in FIG. 3 (b).

Before discussing the details of CARRY logic output circuit, the definition of CARRY is defined. FIG. 25 shows the relationship between the input and output logic levels, the logic operation and the operating point on the I-V characteristics. In this table, $x_i$ and $y_i$ are the ith bits of the two operands X and Y, $C_{in}$ is the input carry from the preceding (i−1)th stage, and $C_{out}$ is the carry out for the addition of $x_i$, $y_i$ and $C_{in}$. The carry $c_{out}$ to be propagated to the next (i+1)th stage, is logical "1" only when two or three of the inputs are logic "1"s. This fact can be used to calculate the carry out of each stage without the conventional carry generation and propagation bits. The AND, OR, NAND, NOR and INVERTING logical outputs are self explanatory.

For devices with NDR characteristics, the present invention can identify and generate CARRY, AND, OR, NAND, and NOR with the same structure of the circuit.

Figures 4A, 4B:
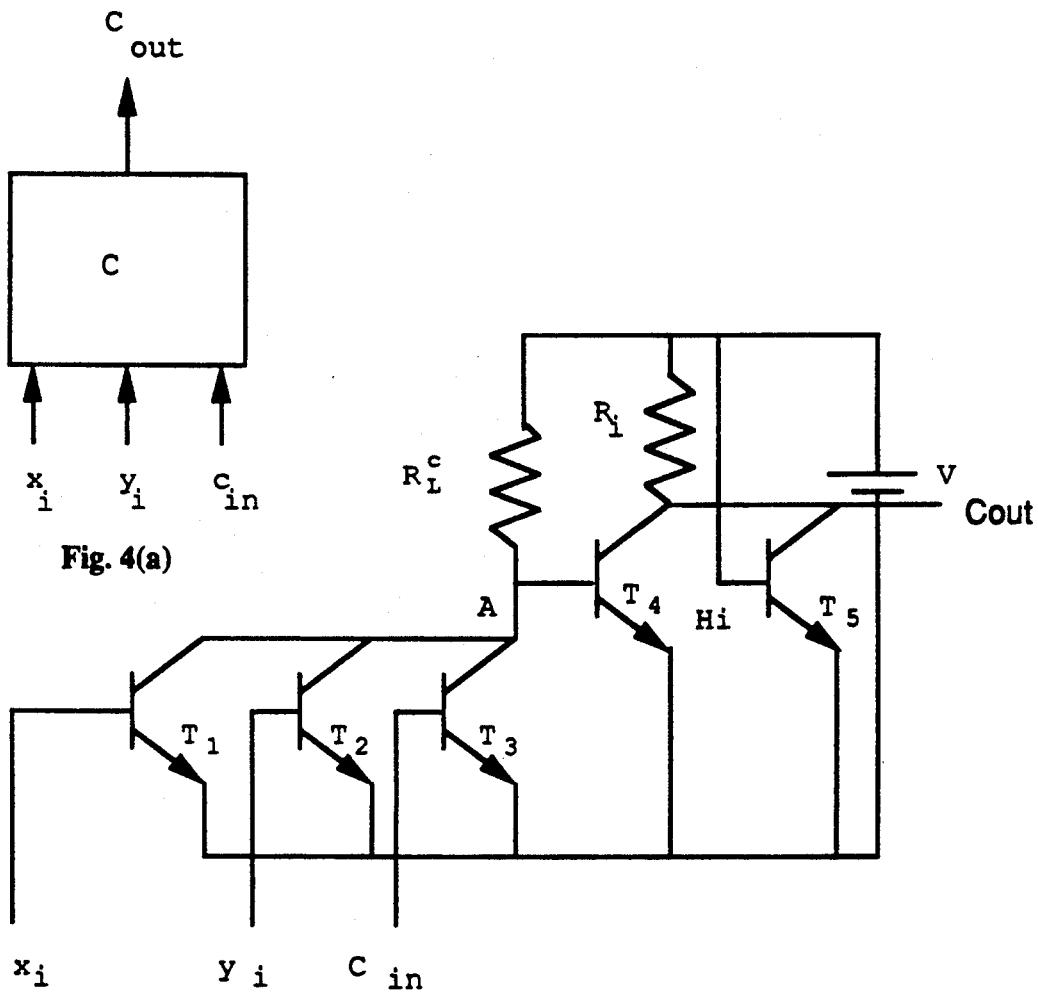
FIG. 4(a) is the logic symbol of the circuit to produce complement of carry, NAND and NOR logic, which is concatenated with the inverting circuitry, to generate carry, AND and OR logic.
FIG. 4(b) is the schematic diagram of the circuit to produce complement of carry, NAND and NOR logic, which is concatenated with the inverting circuitry, to generate carry, AND and OR logic.
Figure 5:
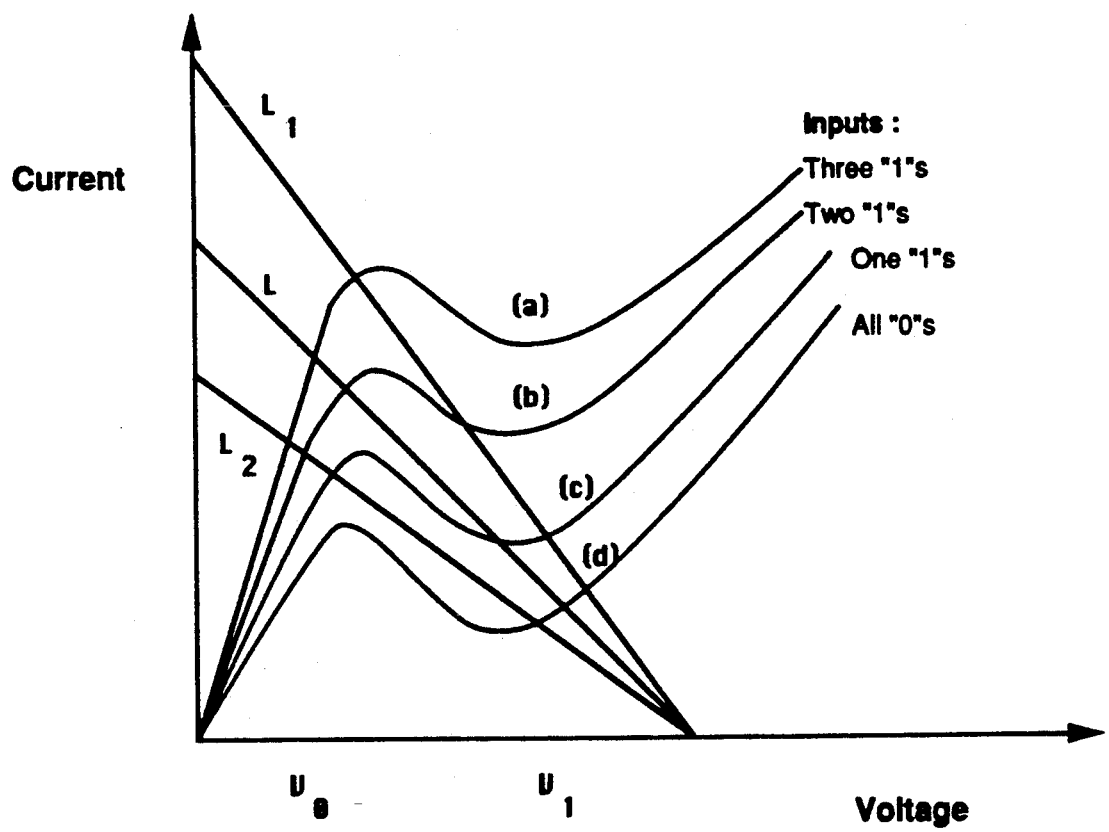
FIG. 5 shows the current-voltage characteristics with load lines $L_1$ for NAND, L for complemented carry out, and $L_2$ for NOR applications.

When three transistors with negative differential resistance (NDR) characteristics are connected as in FIG. 4, the I-V characteristics at node A of FIG. 4 are as shown in FIG. 5. The curves, (a), (b), (c) or (d) of FIG. 5 are obtained depending on the inputs at the base of each transistor. When all the three inputs are "1"s, the curve (a) corresponding to the highest peak current is obtained. The curves with lower peak currents (b), (c), and (d) are obtained as the number of logical "1"s at the inputs reduce. The load resistance $R^c_L$ in FIG. 4 is selected in such a manner that, when there are two or more logical "1"s at the inputs, i.e., when the carry condition is satisfied, the current through $R^c_L$ is large, and the operating point is at the intersection of LOAD LINE L and curve (a) (when all the inputs to the devices are logic "1"), or between LOAD LINE and curve (b) (when two of the three inputs are logic "1"), in FIG. 5, and the output at node A of FIG. 5 (which is the voltage corresponding to the operating point on the X axis of FIG. 5) is at a lower potential $V_0$ (logical "0"). On the other hand, when the carry condition is not satisfied, the operating point is at the intersection of the LOAD LINE L and curve (c) or between LOAD LINE L and curve (d), (depending on whether the number of logic "1"s at the inputs are one or none respectively) and the output at node A is at a higher potential $V_1$ (logical "1"). Hence when a carry condition is satisfied, the potential at node A corresponds to logic "0", and when the carry condition is not satisfied, node A corresponds to logic "1". Thus a complement of carry is obtained at node A. $T_4$ and $T_5$ in FIG. 4 are for inverting the logic at A.

By selecting appropriate $R^c_L$ in FIG. 4, LOAD LINEs L1 or L2 can be obtained as indicated in FIG. 5. The load line L1 selects the operating point at node A of FIG. 4 so that the voltage at node A corresponds to $V_0$ logic "0" only when all the three inputs are logic "1" (NAND operation). The load line L2 selects the operating point at node A so that the voltage at A corresponds to $V_1$ logic "1" only when all the inputs are "0"s (NOR operation). FIG. 25 shows the output at node A for different input combinations, for NAND and NO logic.

By observing FIG. 5, it is found that the intersection points of the load line L with I-V curve (a) and I-V curve (b) are clustered together corresponding to the voltage $V_0$ and the intersection points of the load line L and I-V curve (c) and I-V curve (d) are clustered together corresponding to $V_1$. Similarly, the intersection point of the load line $L_1$ with the I-V curve (a) corresponds to $V_0$ while the intersection of $L_1$ with I-V curves (b), (c) and (d) are clustered together corresponding to voltage $V_1$. The intersection points of L2 with I-V curve (a),(b) and (c) are clustered together corresponding to voltage $V_0$, while the intersection of L2 with I-V curve (d) corresponds to voltage $V_1$. The load lines L, $L_1$ and $L_2$ thus differentiate the two logic levels at the output. By setting different load lines, the same structure can generate different logical outputs. The same principle applies to field effect transistors, bipolar junction transistors and to their variations exhibiting negative resistance.

Figure 6A:
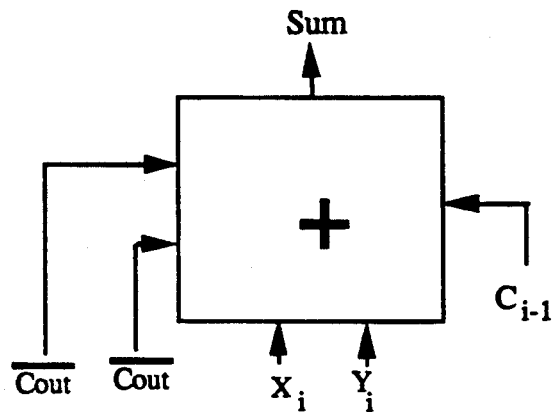
FIG. 6(a) is a logic symbol of the sum circuit.

To obtain the sum, five transistors with NDR are connected as in FIG. 6. The inputs of two of the transistors are connected to the complement of the carry out of the same stage, and each of the other input is connected to $x_i$, $y_i$ and $c_{i-1}$ respectively. As illustrated in FIG. 26, the sum bit is logic "1" when three of the five inputs are logic "1". FIG. 7 shows the I-V characteristics of the combination of the five input transistors. The load resistance $R^s_L$ of FIG. 6 is so chosen so as to obtain the load line as in FIG. 7. When there are three "1"s at the input, the condition for sum is satisfied, and the operating point is at $Q_1$. $Q_1$ corresponds to a lower potential, $V_{OL}$ (logic "0"). Thus when condition for generation of sum is satisfied, logic "0" is obtained at node SB of FIG. 6. When condition for sum is not satisfied, the operating point corresponds to a voltage $V_{OH}$ (logic "1"). Hence a complement of sum is obtained at node SB of FIG. 6. $T_6$ and $T_7$ in FIG. 6 are for inverting the logic at node SB as explained in the next paragraph. The sum is then obtained at the output.

Figure 8:
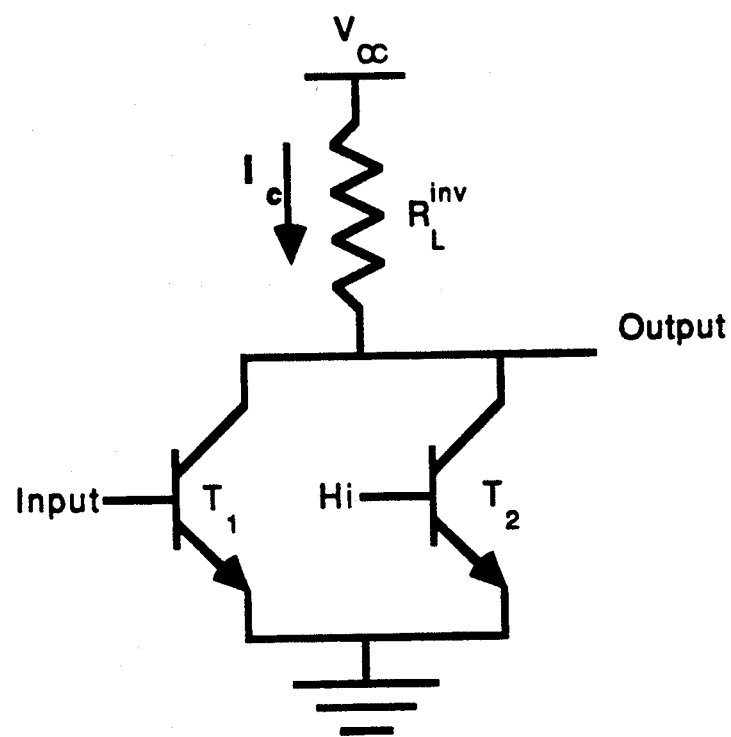
FIG. 8 is a circuit of an invertor
Figure 9:
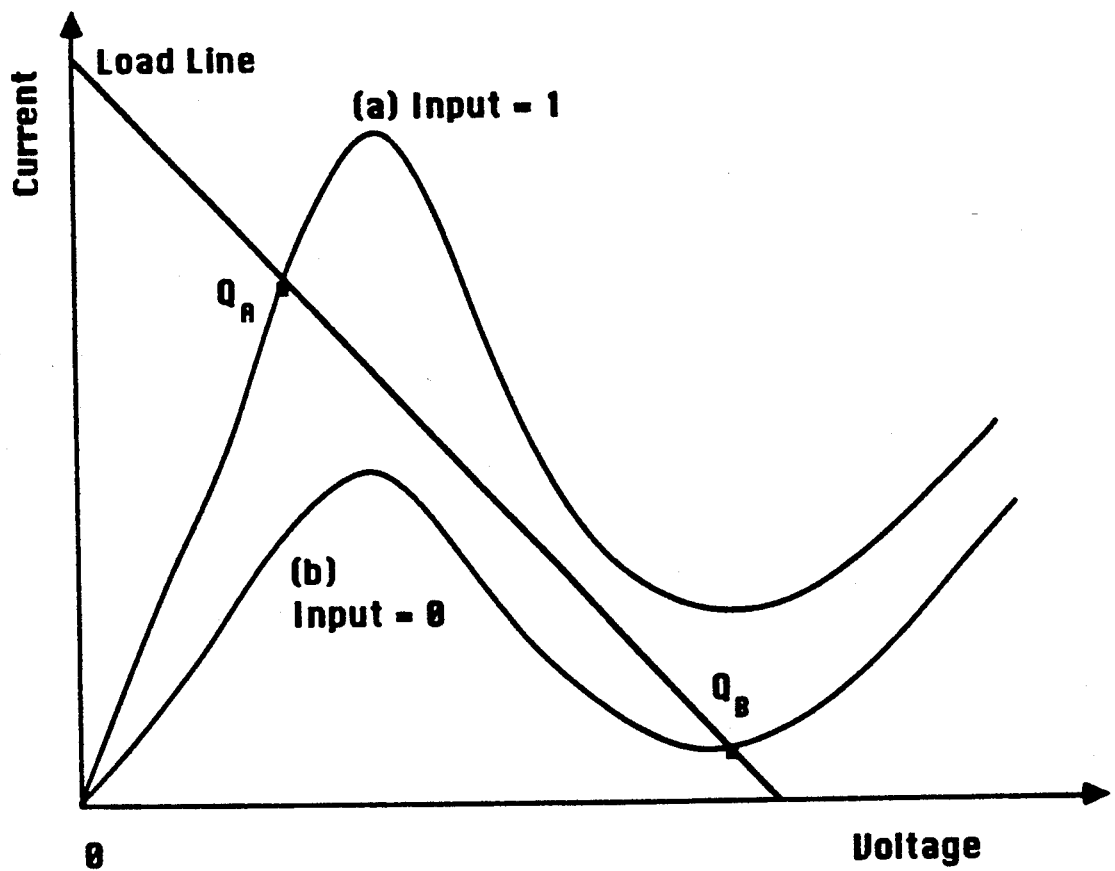
FIG. 9 shows the current-voltage characteristics of the invertor.

Operation as an invertor with two NDR transistors can be achieved as shown in FIG. 8. The base of one of the NDR transistor $T_1$, is connected to the input, and the base of the other transistor $T_2$ is connected permanently high. Curve (a), (b) in FIG. 9 is obtained depending on whether the input at the base of $T_1$ is logic "1" or "0" respectively. The load line, of FIG. 9 is obtained by suitably selecting the load resistance $R^{inv}$ of FIG. 8. When the input to $T_1$ is "1", the I-V characteristics are given by curve (a) of FIG. 9. The operating point will be at $Q_a$, and the current $I_c$ is large. As a result, the output voltage (which is corresponding point on X axis in FIG. 9) is low, logic "0". On the other hand, when the input to $T_1$ is "0", the I-V characteristics are given by curve (b). The operating point is shifted to $Q_B$, the current is small and the output voltage is high, logic "1".

As mentioned above, the resonant tunneling transistor is one of the device which has negative differential resistance (NDR). The operation of the resonant tunneling transistor is based on the resonant tunneling of electrons through quantum wells between energy barriers of energy.

Figure 10:
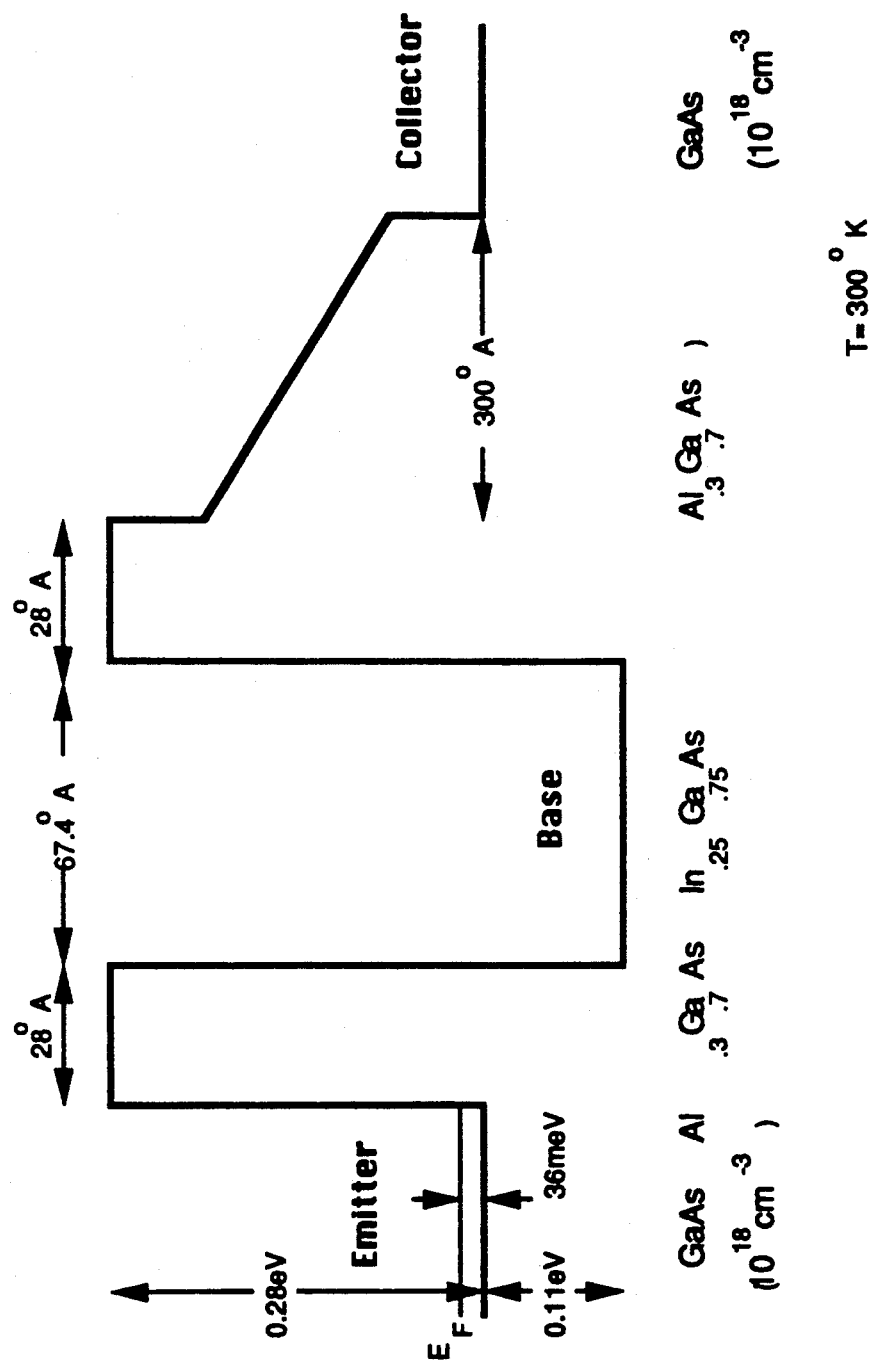
FIG. 10 is the conduction band diagram of resonant tunneling transistor used to obtain current-voltage characteristics of FIG. 11 through FIG. 18.

FIG. 10 shows the double barrier structure of the resonant tunneling transistor that is used as a model in FIG. 11 through FIG. 17 which will be discussed hereinafter. The total barrier height in this model is 0.28 eV. Because of this, the voltage levels in this design are low. A barrier height around 1 eV is achievable. As a result the voltage levels will increase to more favorable values, which will both improve noise margins and make the operation less critically dependent on the circuit and device parameters.

The double barrier structure could be incorporated in one of the terminals of any three terminal device to obtain resonant tunneling. The experimental results (I-V characteristics) obtained by incorporating the double barrier tunnel structure with a vertical field effect transistor (VFET), a planar metal semiconductor FET (MESFET), and other transistors based on resonant tunneling are similar to the ones illustrated in FIGS. 5,7,9,11,13 and 15 and discussed above. The voltage location and peak to valley ratio is controlled with the voltage at the control terminal. Similar characteristics have also been obtained for resonant tunneling hot electron transistors (RTHET). Thus, the same method of obtaining the carry out in a single stage delay also holds for the transistors which have double barrier structures incorporated.

The $I_e$-$V_{be}$ and $I_e$-$V_{ce}$ characteristics of resonant tunneling transistors can be used to generate logic outputs. By suitably choosing the parameters of the resonant tunneling transistor, it is shown that carry out, AND and OR logic can be generated in one stage delay, and the need for inversion can be eliminated. Resonant tunneling transistors can switch in less than a picosecond so that allowing for circuit parasitic, carry generation with this circuit should be possible in 3-5 ps. Even with a ripple carry, a 64 bit adder would then have a delay of 200-300 ps. In contrast, an ECL design of eight 8-bit carry look-ahead sections would take around 3400 ps (estimated on the basis of 200 ps delay per gate, with three gate delays in the first eight bits and two gate delays in the remaining seven sections). The transistor count in the carry chain is also reduced substantially from around 2500 to 192 with a corresponding decrease in power.

Figure 11:
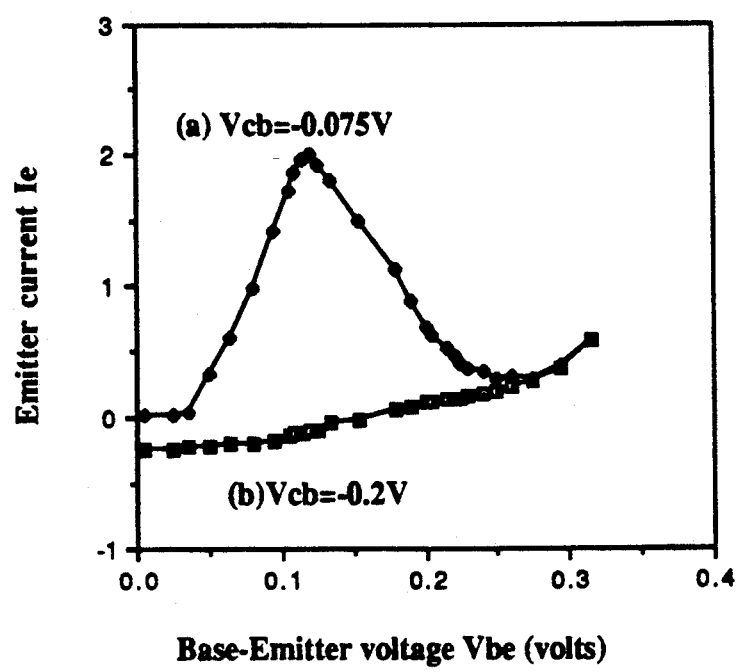
FIG. 11 is the $I_e$-$V_{be}$ characteristics for the resonant tunneling transistor.

Based on the Ie-Vbe characteristics, more advanced logic circuit can be designed. Computed values of the emitter current ($I_e$) versus base-emitter voltage ($V_{be}$) characteristics of a resonant tunneling transistor with the conduction band diagram as in FIG. 10 are shown in FIG. 11. Curve (a) of FIG. 11 is obtained for $V^1_{cb} \approx -0.08$ V (logic "1") and curve (b) is for $V^0_{cb} \approx -0.2$ V (logic "0").

Figure 12A:
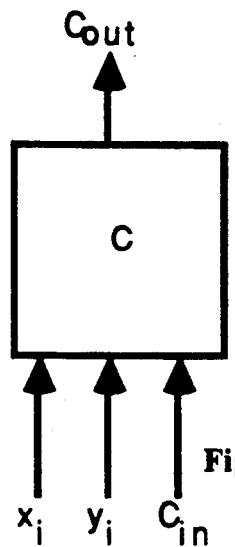
FIG. 12(a) is the logic symbol of the circuit to generate carry out, AND and OR logic in a single step, ie, without requiring the invertor stage.
Figure 12B:
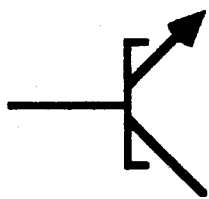
FIG. 12(b) is the symbol for resonant tunneling transistor.
Figure 12C:
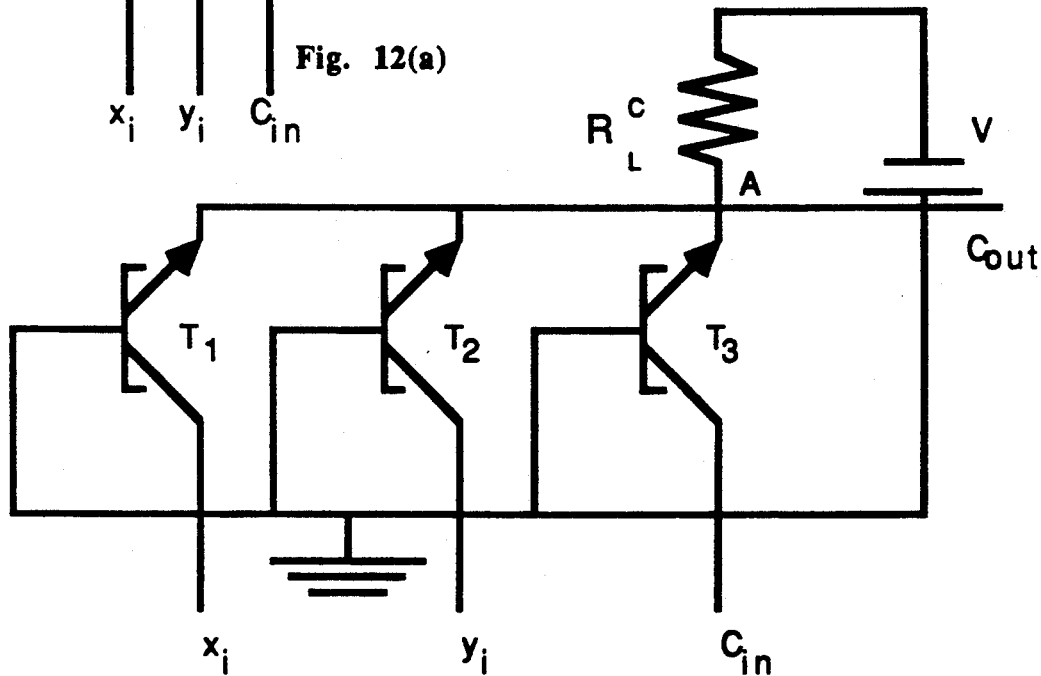
FIG. 12(c) is the schematic of the circuit to generate carry, AND and OR logic in a single device delay.
Figure 13:
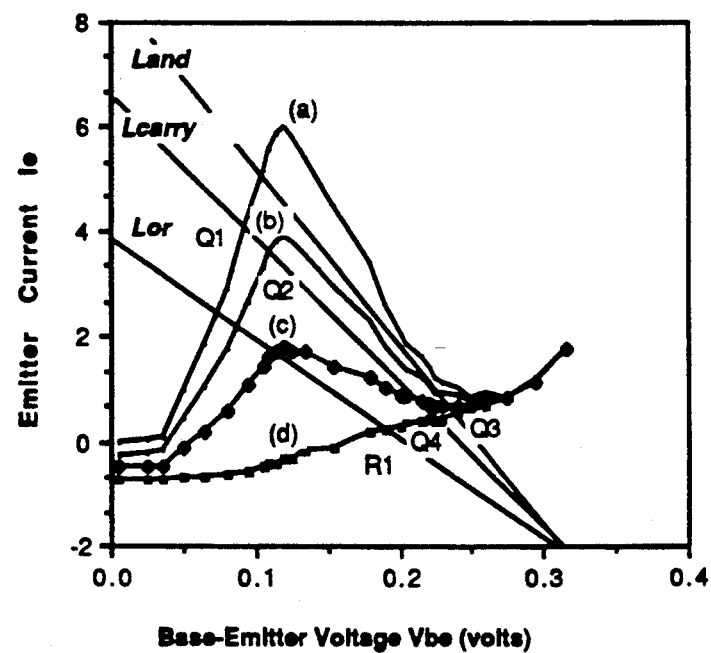
FIG. 13 shows the simulation results for $I_e$-$V_{be}$ characteristics of three resonant tunneling transistors connected as in FIG. 12(c)

In the present invention, the resonant tunneling transistors are connected as shown in FIG. 12(c) in which all the bases connect to ground and the output is the Veb (the voltage at the emitter with respect to the base). The input signals $x_i$ and $y_i$ represent the ith bit of the operands X and Y, and $c_{in}$ is the input carry from the preceding (i−1)th stage. It may be noted that a stage i generates a carry only when three or two of the input bits are "1". Under these conditions, the curves (a) and (b) of FIG. 13 are obtained respectively. The load resistance $R^c_L$ in FIG. 12(c) is chosen so as to obtain the load line Lcarry in FIG. 13. Thus, when a carry condition is satisfied, the operating point is $Q_1$ (when three inputs are "1"s) with three transistors conducting, or $Q_2$ (when two inputs are "1"s) with two transistors conducting. $Q_1$ and $Q_2$ represent the potential at node A in FIG. 12(c). The voltage corresponding to $Q_1$ and $Q_2$ is 0.075V (approximately), from FIG. 13. The potential at node A is $V_{eb}$, from FIG. 12(c). From FIG. 13, $V_{be}$ corresponding to $Q_1$ and $Q_2$ is 0.075V (approximately). Hence potential at node A is $V_{eb} = -V_{be} = -0.75V = V_{cb}^1$ (logic "1" for the input to next stage, because the node A is connected to collector of next stage).

On the other hand, when the condition for carry is not satisfied, the operating point is at $Q_3$ (one input is logic "1") or $Q_4$ (no inputs are logic "1"). The load current is smaller, and the operating points $Q_3$ and $Q_4$ correspond to the potential $V_{be}=0.22V$ (approximately). From FIG. 12(c), the potential at node A is $V_e b = -V_{be} = -0.22V = V^0_{cb}$ (corresponding to logic "0" for the input to next stage) Thus an inversion of the output is not needed when the circuits are cascaded since the uninverted $c_{out}$ is already produced at point A. The carry for the next stage is thus generated in one transistor delay.

When the three inputs ($x_i$, $y_i$, or $c_{in}$) in FIG. 12(c) are logic "1", the AND logic output must be "1", and the I-V characteristics corresponding to curve (a) of FIG. 13 is obtained. The load line "$L_{and}$" is so chosen so as to obtain the operating point P1 when all the inputs are logic"1". Similarly when one or more of the inputs is logic"0", the operating point is on curve (b), (c) or (d) respectively. The voltage $V_{be}$ corresponding to P1 is approximately 0.08V. Hence the "$C_{out}$" in FIG. 12(c) corresponds to $V_{eb} = -0.08V$. This corresponds to logic "1". The voltage corresponding to the operating points clustered together on curves (b), (c) or (d) is approximately 0.22V. Hence the voltage at "Cout" is −0.22V corresponding to logic"0". Hence the AND logic operation is performed in a one device delay.

Similarly, only when all the inputs at $x_i$, $y_i$ and $c_{in}$ are logic "0", the OR logic is "0". The load line "Lor" in FIG. 13 is chosen to obtain the operating point R1 on curve (d) when all the inputs are logic "0". When one or more of the inputs is a logic"1", the operating point is on curve (c), (b) or (a) respectively. The voltage $V_{be}$ corresponding to $R_1$ is approximately 0.2V. Hence "$C_{out}$" in FIG. 12(c) corresponds to $V_{eb} = -0.2V$. This corresponds to logic"0". The voltage $V_{be}$ corresponding to operating points on curves (a),(b) or (c) is approximately 0.08V. Hence the voltage at "Cout" is −0.08V corresponding to logic"1". Hence the OR logic is obtained in a one device delay.

Figure 14:
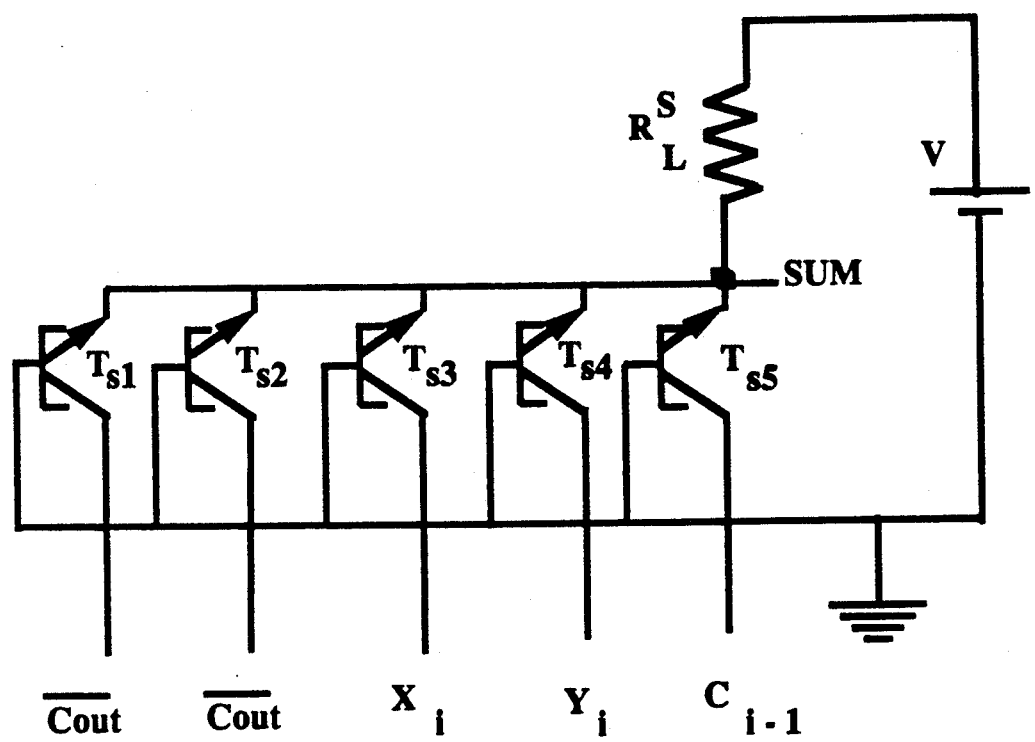
FIG. 14 is the schematic for generating sum in a single device delay.
Figure 15:
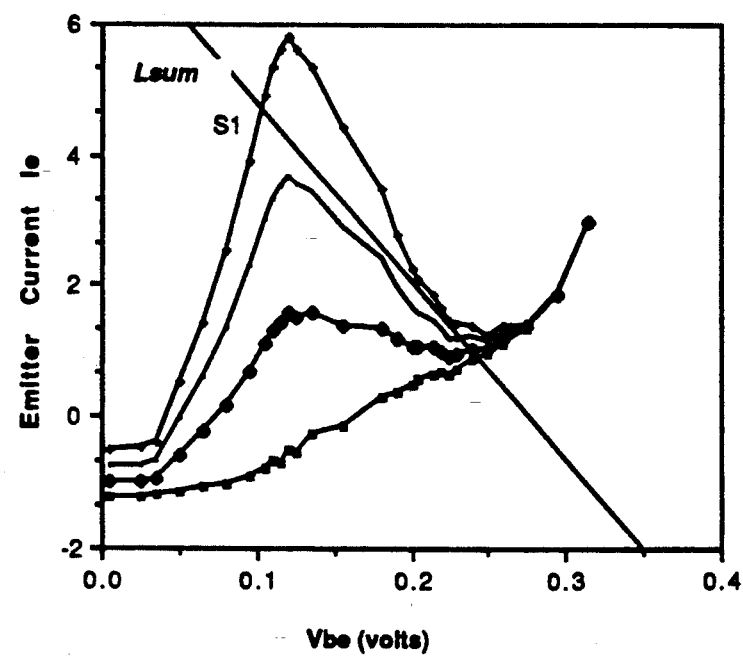
FIG. 15 illustrates the Ie-Vbe characteristics for the schematic of FIG. 14.

FIG. 14 is the circuit diagram to generate the sum bit. FIG. 15 shows the I-V characteristics simulated for the schematic of FIG. 14. The five inputs in FIG. 14 include the two operand bits $x_i$ and $y_i$, the carry from the previous stage $C_{i-1}$, and two complements of carry of the same stage. When three of these five inputs are either logic "1" or logic "0", the sum bit generated will be logic"1" or logic"0" respectively. FIG. 26 illustrates FIG. 26 the condition when the sum bit will be generated. The load line "$L_{sum}$" in FIG. 15 is so chosen so as to obtain the operating point at S1 when three of the inputs are logic"1". When three or more of the inputs are logic"0", the operating point is on curve (b), (c) or (d) respectively. The voltage $V_{be}$ corresponding to S1 is approximately 0.07V. Hence the "Sum" in FIG. 14 corresponds to $V_{eb} = -0.07V$. This corresponds to logic"1". The voltage $V_{be}$ corresponding to operating points on curve (b), (c) or (d) is approximately 0.22V. Hence the voltage 1 at "Sum" in FIG. 14 is −0.22V corresponding to logic"0". Hence the sum bit is generated.

Figure 6B:
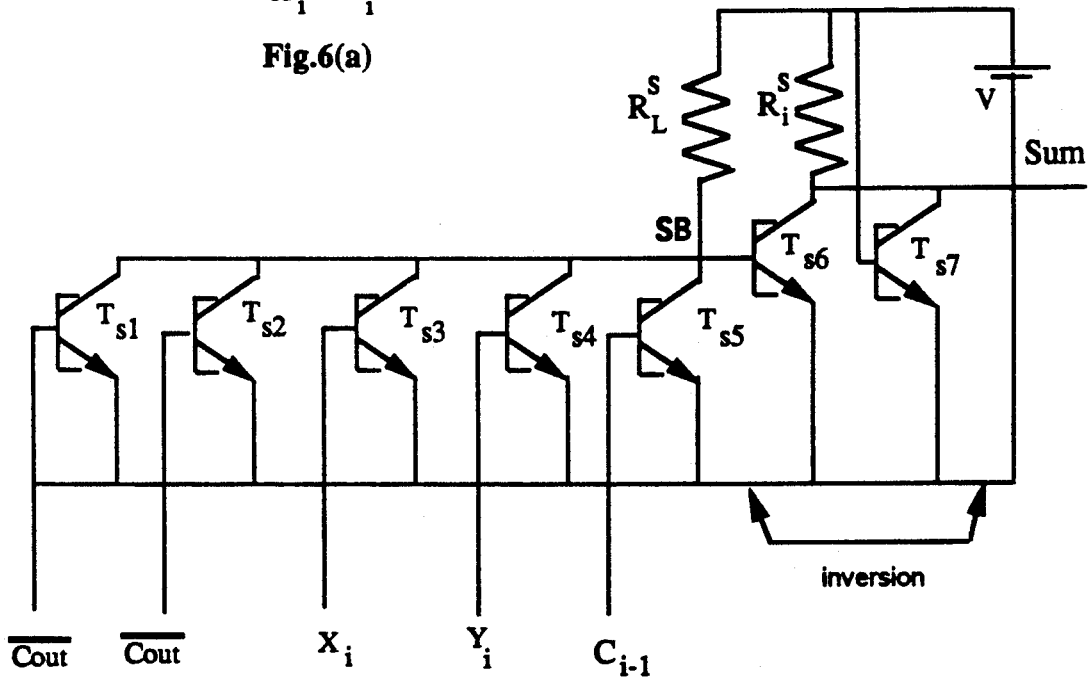
FIG. 6(b) is the schematic diagram of the sum circuit which includes the sum stage.
Figure 7:
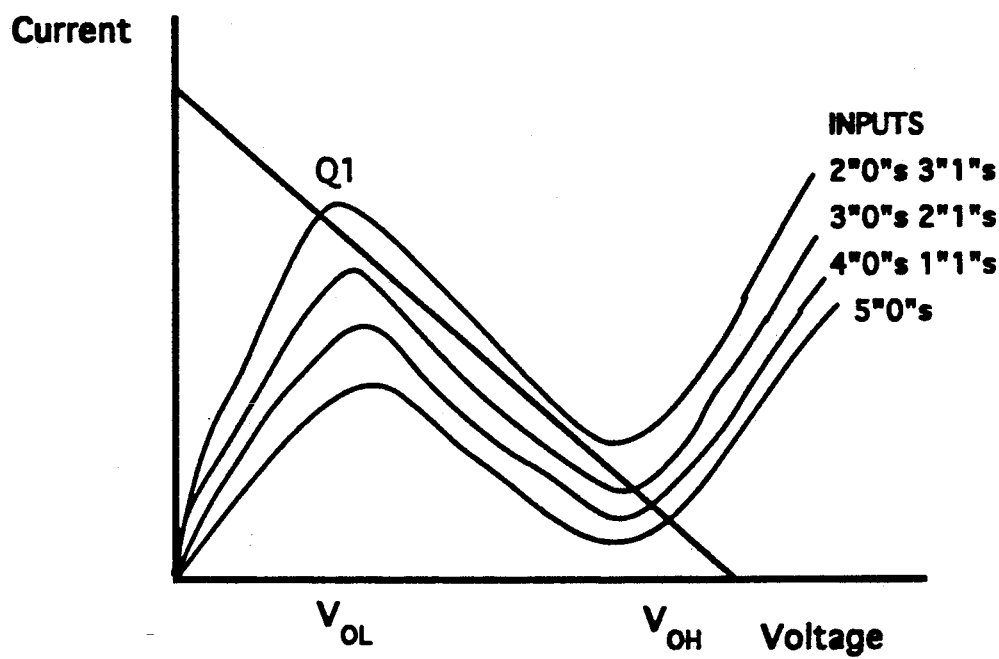
FIG. 7 shows the V-I characteristics for the generation of complement of sum.
Figure 16:
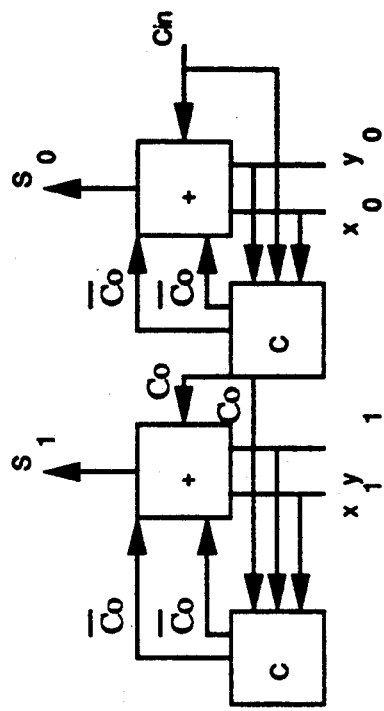
FIG. 16 is the schematic diagram of a 64 bit adder using the proposed approach.
Figure 16:
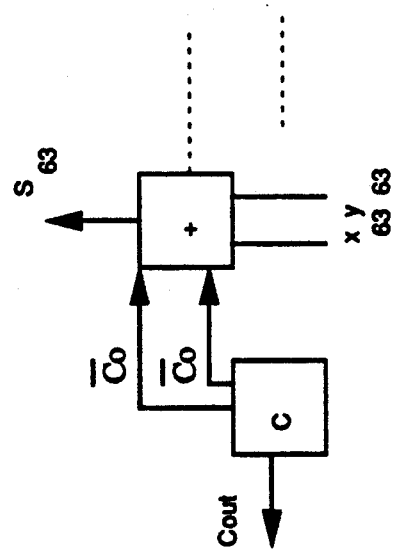

FIG. 16 shows how a carry generating unit of FIG. 4(b) can be connected with a sum generating unit of FIG. 6(b) or a carry generating unit of FIG. 12(c) can be connected to a sum generating unit of FIG. 14 to form a 64-bit ripple-carry adder.

Figure 18:
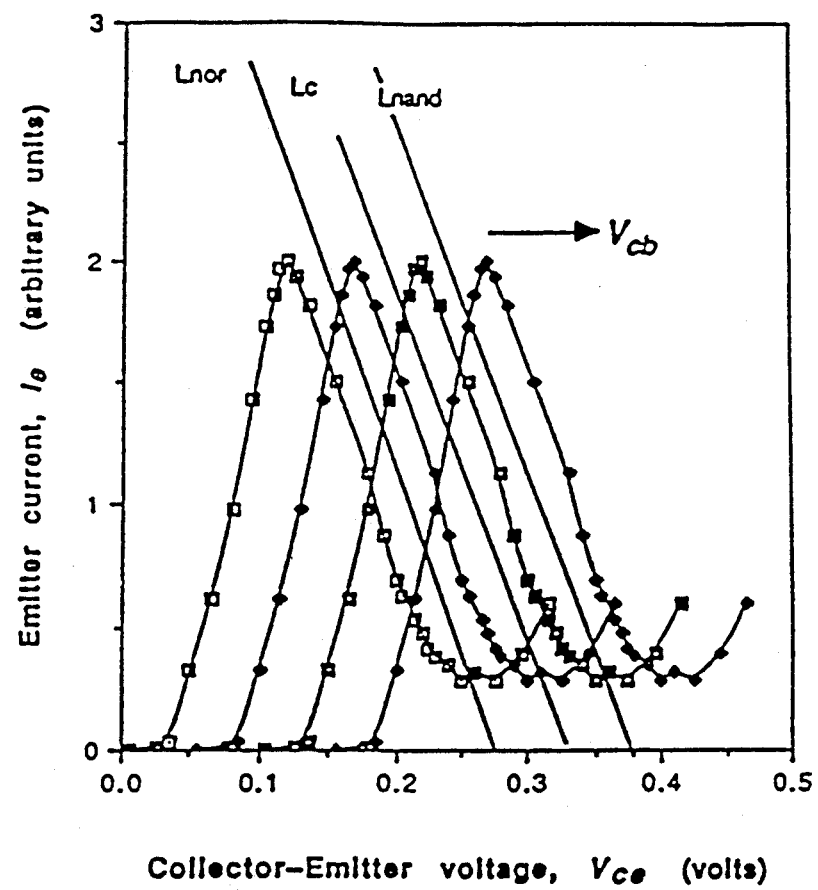
FIG. 18 shows the simulation results for $I_e$-$V_{ce}$ characteristics for the resonant tunneling transistor with $V_{cb}$ as parameter.

$I_e$-$V_{ce}$ characteristics of a resonant tunneling transistor are shown in FIG. 18 for various values of $V_{cb}$. The peak shifts towards the right as $V_{cb}$ increases. When all the three inputs are logic "0", curve (a) in FIG. 18 is obtained; when two inputs are logic"0" and one input is logic"1", curve (b) is obtained; when one input is logic"0" and two inputs are logic"1", curve (c) is obtained; when all the three inputs are logic"1", curve (d) is obtained.

Figure 17:
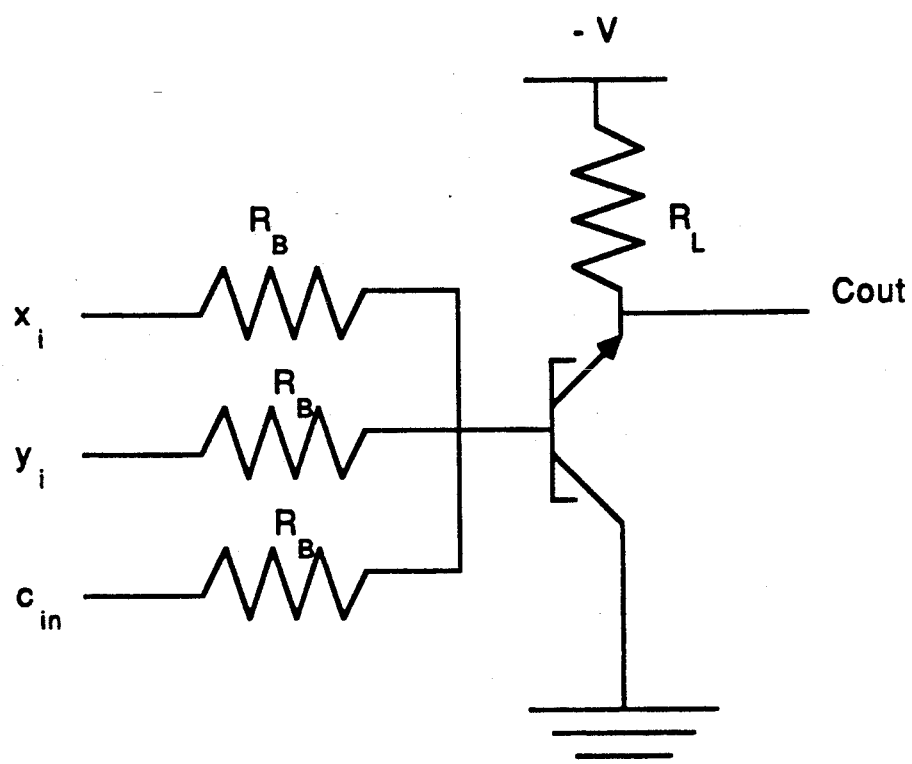
FIG. 17 is the circuit to produce the I-V characteristics shown in FIG. 18.

When a resonant tunneling transistor is connected as shown in FIG. 17, with inputs connected to the base of the transistor, $R_L$ in FIG. 17 can be chosen to obtain the load lines $L_{NOR}$, $L_c$, $L_{NAND}$ of FIG. 18, corresponding to NOR, Complement Carry, and NAND logic at the output. The complement of carry obtained, may then be inverted by using the inverting principle illustrated in FIG. 8 and FIG. 9 and described previously, to obtain carry out.

Figure 19:
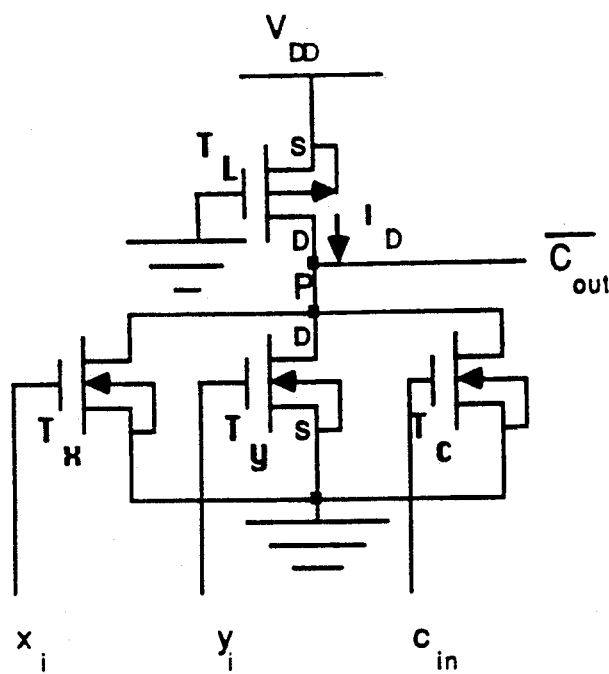
FIG. 19(a) is the schematic for generating complement of carry, NAND and NOR logic, using FETs.
FIG. 19(b) shows the $I_D$-$V_{out}$ characteristics with FETs and the operating points.
Figure 19:
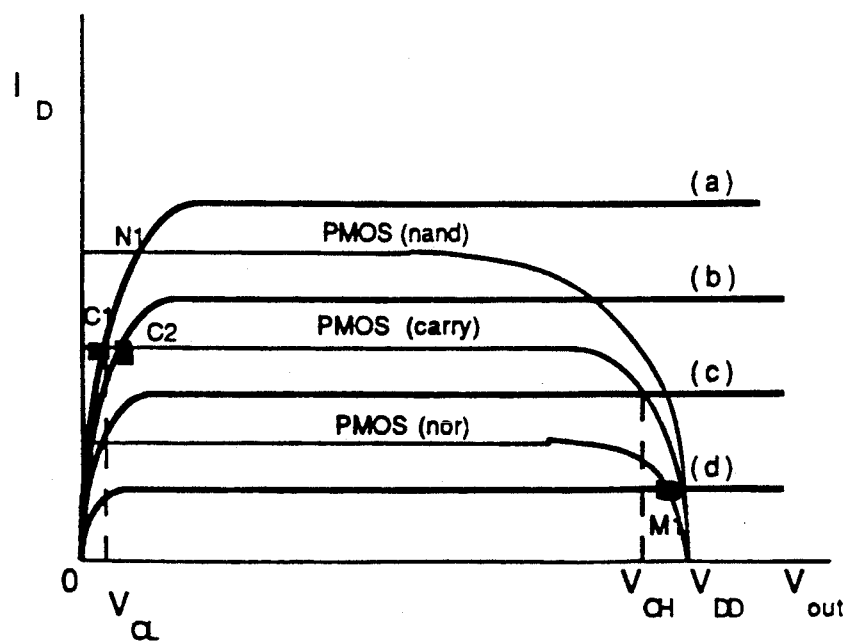

The FETs can also be used to design circuits under the same principle. Three n channel FETs and one p channel FET are connected as shown in FIG. 19(a). The W/L ratios of these transistors can be suitably adjusted to obtain the characteristics as in FIG. 19(b).

The curves (a), (b), (c) and (d) in FIG. 19(b) are obtained according to as the number of logic "1" s at the inputs $x_i$, $y_i$, $c_{in}$ are three, two, one and nil respectively. The p channel transistor functions as an active load.

When the number of logic "1" s at the inputs are two or three, the carry condition is satisfied. The operating point is at $C_1$ or $C_2$ in FIG. 19(b), and the potential at node P in FIG. 19(a) is at low potential corresponding to $V_{OL}$ (logic 0). Thus, a complement of carry out is generated at node P in one transistor delay. The output at node P is then inverted to obtain the carry out. By suitably adjusting the p channel FET parameters, the I-V characteristics corresponding to "PMOS(nand)", and "PMOS(nor)" can be obtained to generate nand and nor logic respectively.

When all the inputs in FIG. 19(a) are logic"1", the I-V characteristics corresponding to curve (a) of FIG. 19(b) are obtained, and the operating point is at N1, corresponding to the voltage $V_{OL}$, logic"0". When one or more of the inputs are logic "0", the operating point will be on the curve (b), (c) or (d) of FIG. 19(b) respectively, clustered around the voltage $V_{OH}$, corresponding to logic"1". Hence the NAND logic is achieved in a single device delay.

When all the inputs in FIG. 19(a) are logic"0", the I-V characteristics corresponding to curve (d) of FIG. 19(b) are obtained, and the operating point is at $M_1$, corresponding to the voltage $V_{OH}$, logic"1". When one or more of the inputs are logic "1", the operating point will be on the curve (c), (b) or (a) of FIG. 19(b) respectively, clustered around the voltage $V_{OL}$, corresponding to logic"0". Hence the NOR logic is achieved in a single device delay.

Figure 20:
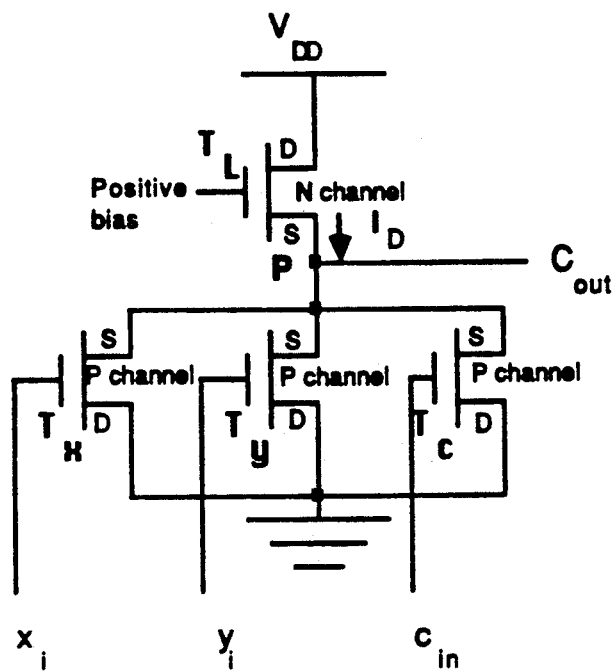
FIG. 20(a) is the schematic for generating carry, AND and OR logic, using FETs.
FIG. 20(b) shows the $I_D$-$V_{out}$ characteristics for the schematic of FIG. 20(a) and the operating points.
Figure 20:
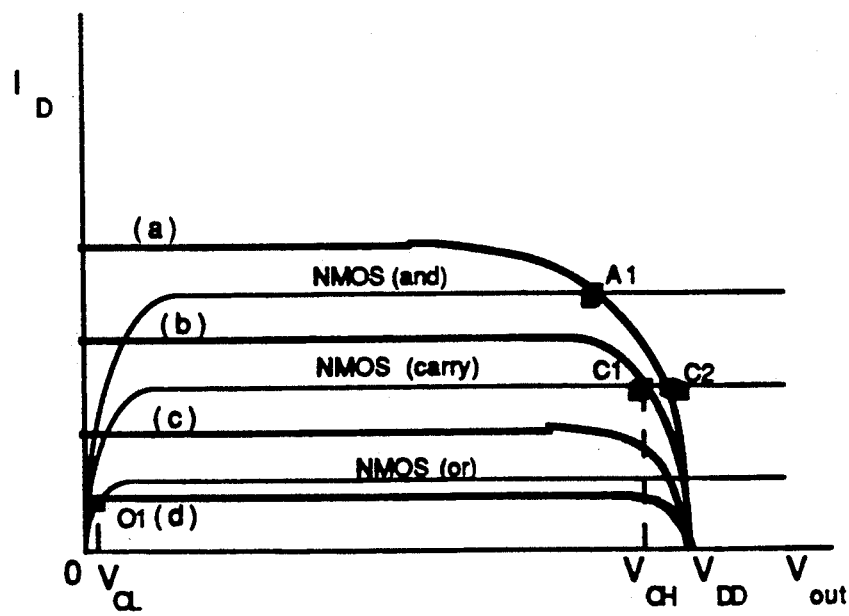

Three p channel FETs and one n channel FET are connected as shown in FIG. 20(a). The W/L ratios of these transistors can be suitably adjusted to obtain the characteristics as in FIG. 20(b).

The curves (a), (b), (c) and (d) in FIG. 20(b) are obtained according to as the number of logic "1" s at the inputs $x_i$, $y_i$, $c_{in}$ are three, two, one and nil respectively. The n channel transistor functions as an active load.

When the number of logic "1"s at the inputs are two or three, the carry condition is satisfied, and the operating point is at the intersection of the load line "NMOS(carry)" and curve(b) or curve(a) respectively, at $C_1$ or $C_2$ in FIG. 20(b), and the potential at node P in FIG. 20(a) is at high potential corresponding to $V_{OH}$ (logic 1). Thus, a carry out is generated at node P in one transistor delay. By suitably adjusting the n channel FET parameters, the I-V characteristics corresponding to "NMOS(AND)", and "NMOS(OR)" can be obtained to generate AND and OR logic respectively.

When all the inputs in FIG. 20(a) are logic"1", the I-V characteristics corresponding to curve (a) of FIG. 20(b) are obtained, and the operating point is at A1, corresponding to the voltage $V_{OH}$, logic"1". When one or more of the inputs are logic "0", the operating point will be on the curve (b), (c) or (d) of FIG. 20(b) respectively, clustered around the voltage $V_{OL}$, corresponding to logic"0". Hence the AND logic is achieved in a single device delay.

When all the inputs in FIG. 20(a) are logic"0", the I-V characteristics corresponding to curve (d) of FIG. 20(b) are obtained, and the operating point is at 01, corresponding to the voltage $V_{OL}$, logic"0". When one or more of the inputs are logic "1", the operating point will be on the curve (c), (b) or (a) of FIG. 20(b) respectively, clustered around the voltage $V_{OH}$, corresponding to logic"1". Hence the OR logic is achieved in a single device delay.

Figure 21:
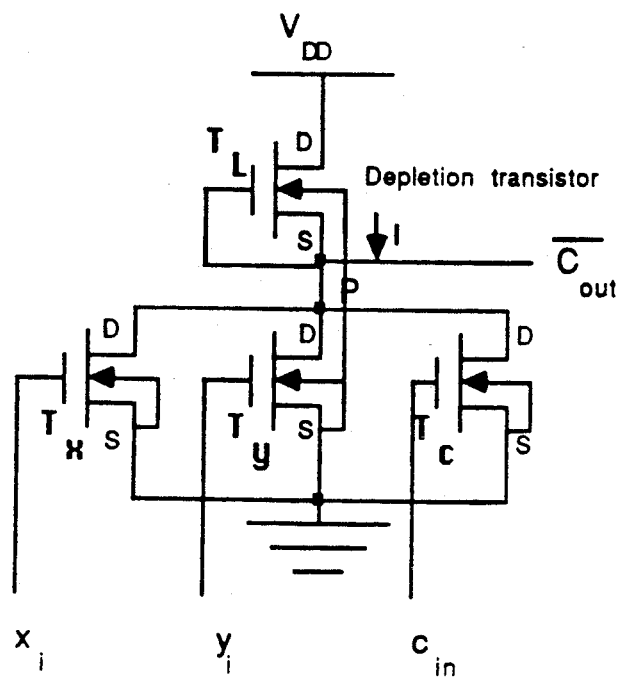
FIG. 21(a) is the schematic for generating complement of carry, NAND and NOR logic, using FETs and a depletion transistor for load.
FIG. 21(b) shows the V-I characteristics with depletion load.
Figure 21:
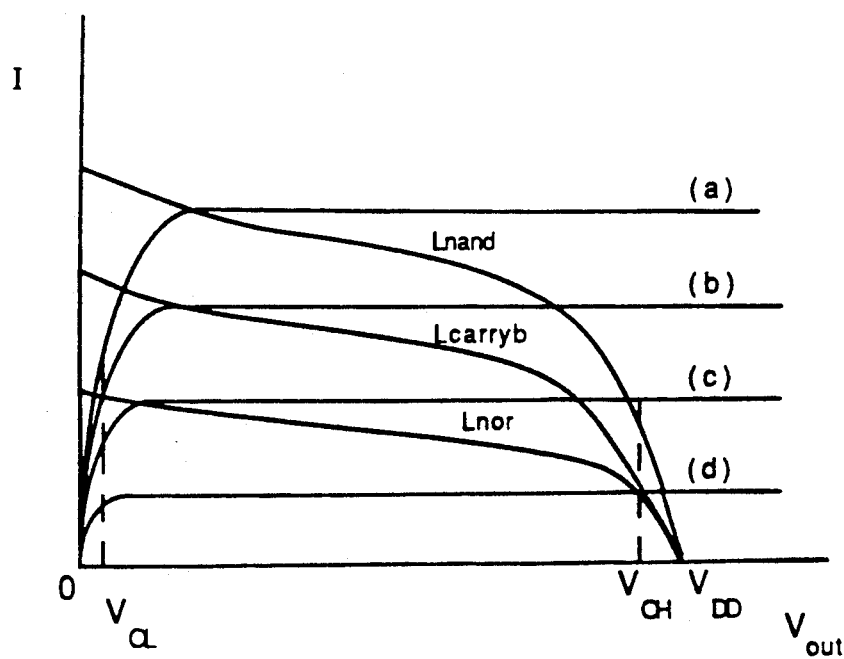

When four n channel FETs are connected as shown in FIG. 21(a). The W/L ratios of these transistors can be suitably adjusted to obtain the characteristics as in FIG. 21(b). The configuration of FIG. 21(a) is called the enhancement-depletion technology. The n channel field effect depletion transistor replaces the p channel FET of FIG. 19(a). The n channel FET functions as a depletion load. The technique of generation of complement of carry, NAND and NOR is similar to that explained earlier with the p channel FET as a load device.

Figure 22A:
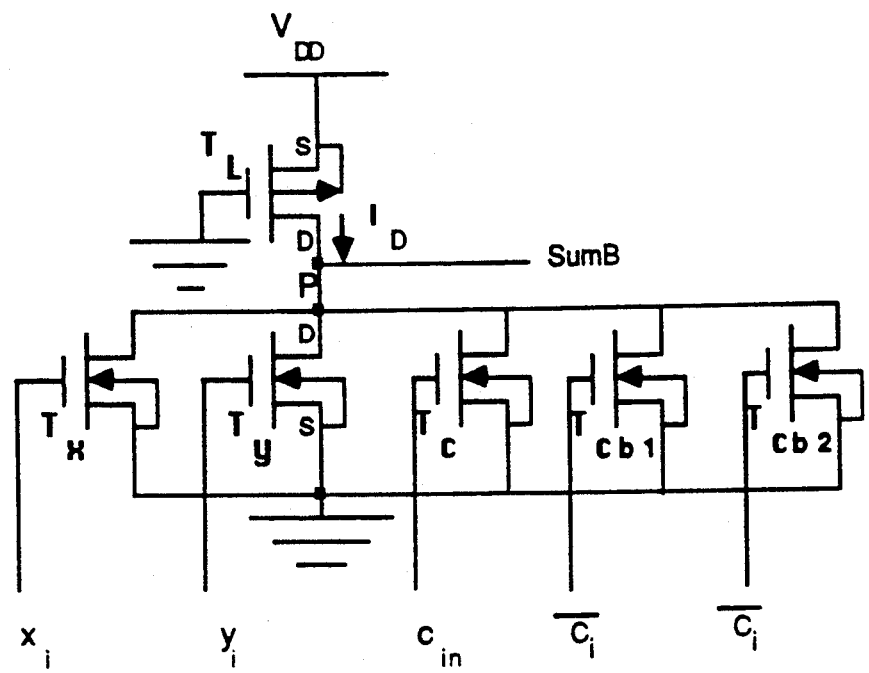
FIG. 22(a) shows the schematic for generating complement of sum using FETs.
Figure 22B:
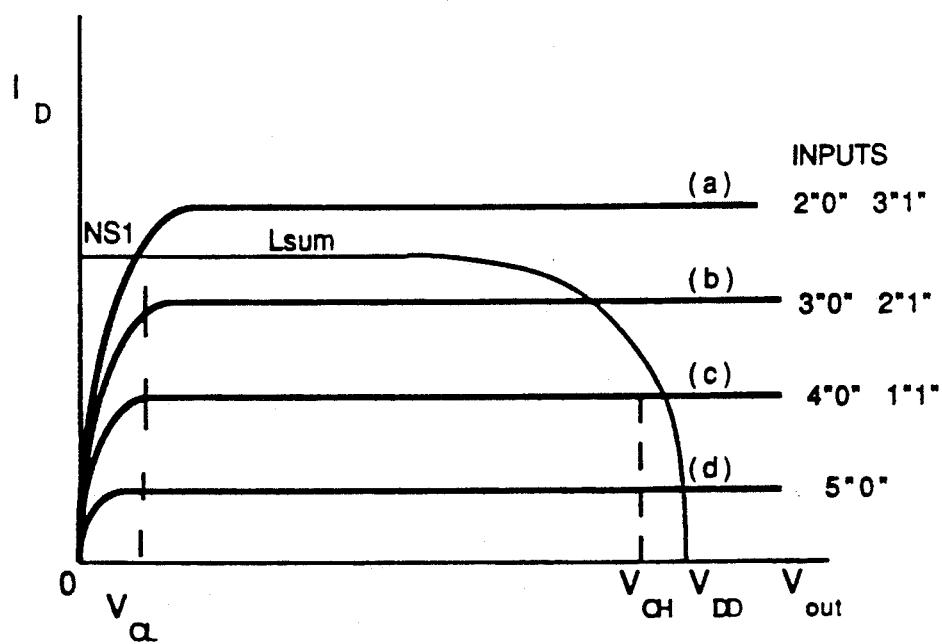
FIG. 22(b) shows the $I_D$-$V_{out}$ characteristics for the schematic of FIG. 22(a) and the operating points.

FIG. 22(a) shows the circuit diagram to generate the complement of sum bit. Five n channel FETs and one p channel FET are connected as shown in FIG. 22(a). The five inputs at the gate of the n channel FETs include the two operand bits $x_i$ and $y_i$, the carry from the previous stage $C_{i-1}$, and two complements of carry of the same stage. When three of these five inputs are either logic "1" or logic "0", the sum bit generated will be logic"1" or logic"0" respectively. FIG. 26 illustrates the condition when the sum bit will be generated. The load line "Lsum" in FIG. 22(b) is so chosen so as to obtain the operating point at $NS_1$ in FIG. 22(b) when three of the inputs are logic"1". When three or more of the inputs are logic"0", the operating point is on curve (b), (c) or (d) of FIG. 22(b) respectively. The operating point $NS_1$ corresponds to logic"0". The operating points on curve (b), (c) or (d) are clustered around logic"1". Hence the complement of sum bit is generated.

Figure 23:
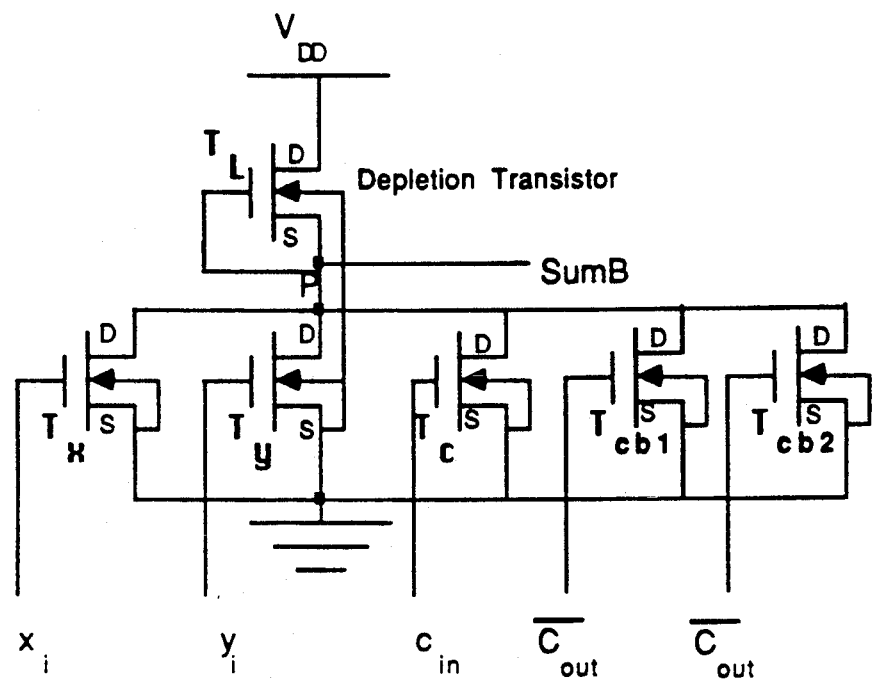
FIG. 23(a) is a schematic for generating complement of sum using FETs and a depletion load.
FIG. 23(b) shows the $I_D$-$V_{out}$ characteristics for the schematic of FIG. 23(a) and the operating points.
Figure 23:
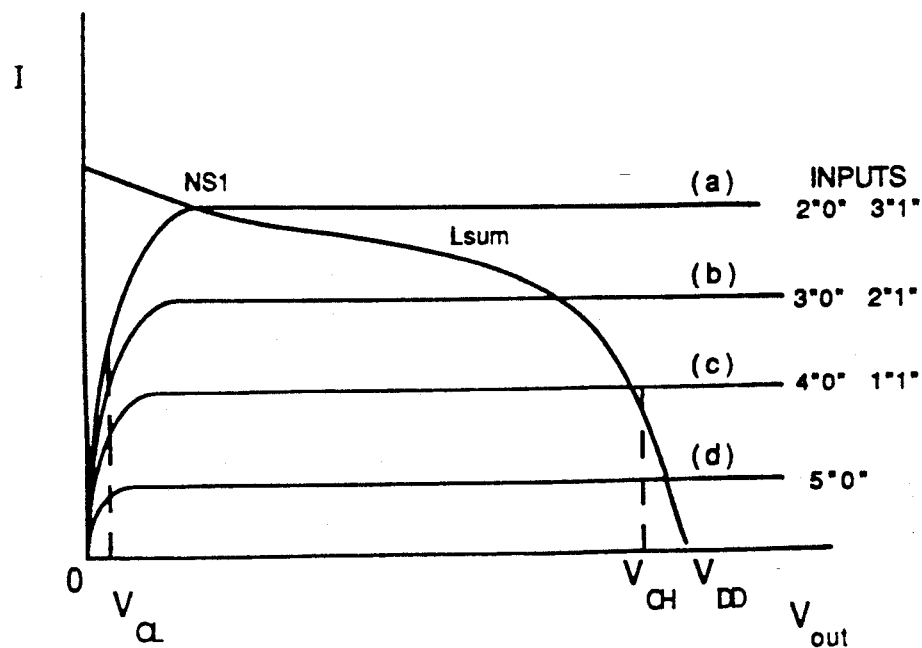

The complement of sum bit is also generated by replacing the p channel FET in FIG. 22(a) with a n channel depletion transistor as shown in FIG. 23(a) to obtain the characteristics as in FIG. 23(b).

Figure 24:
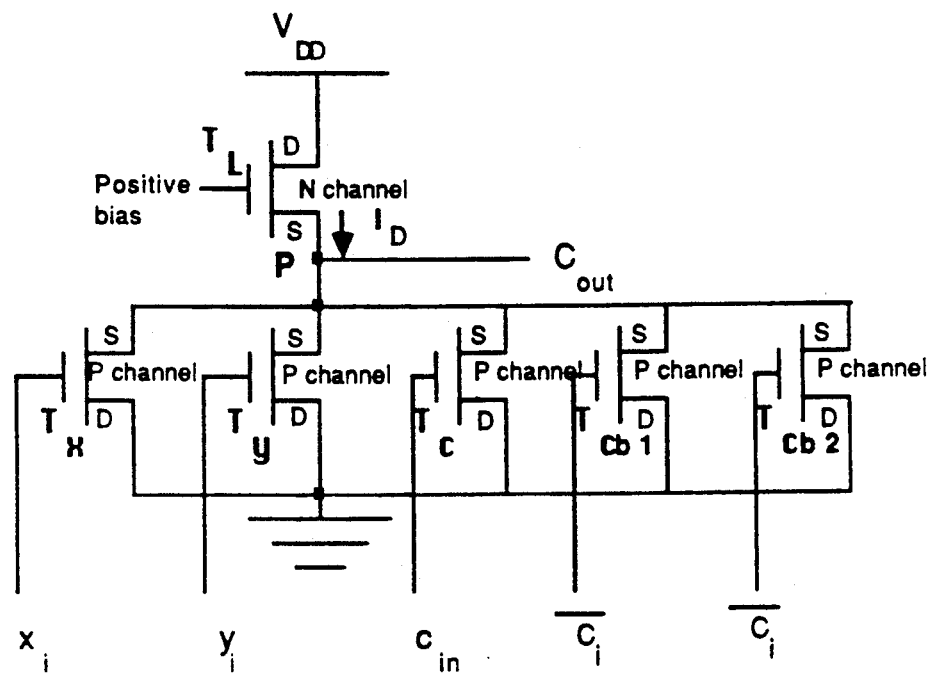
FIG. 24(a) is a schematic for generating Sum.
FIG. 24(b) shows the $I_D$-$V_{out}$ characteristics for the schematic of FIG. 24(a) and the operating points.
Figure 24:
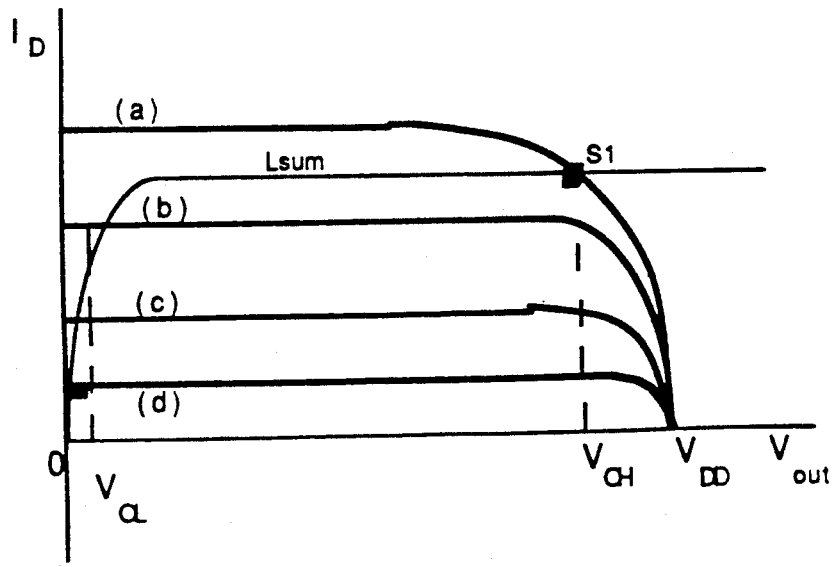

FIG. 24(a) shows the circuit diagram to generate the sum bit. Five p channel FETs and one n channel FET are connected as shown in FIG. 24(a). The five inputs at the gate of the p channel FETs include the two operand bits $x_i$ and $y_i$, the carry from the previous stage $C_{i-1}$, and two complements of carry of the same stage. When three of these five inputs are either logic "1" or logic "0", the sum bit generated will be logic"1" or logic"0" respectively. FIG. 26 illustrates the condition when the sum bit will be generated. The load line "Lsum" in FIG. 24(b) is so chosen so as to obtain the operating point at S1 in FIG. 24(b) when three of the inputs are logic"1". When three or more of the inputs are logic"0", the operating point is on curve (b), (c) or (d) of FIG. 24(b) respectively. The operating point S1 corresponds to logic"1". The operating points on curve (b), (c) or (d) are clustered around logic"0". Hence the sum bit is generated.

The FETs in FIGS. 19 through 24 can be replaced by bipolar transistors, and the active loads can be replaced by resistances to obtain similar results as with FETs.

The present invention has its unique advantage. In the future, the devices will be microminiaturized. The demand for microminiaturization will make the technology lean towards quantum devices which have negative differential resistance (NDR). The present invention uses the NDR characteristic of these devices for digital applications.

The characteristics of resonant tunneling transistors can be exploited to generate the carry for an adder in as few as three transistors. Other logic functions can also be realized. Because of the fast switching speed of these transistors, a carry can be generated in possibly as little as 3-5 ps. Using a ripple-carry, a 64 bit adder would then have a delay of 200-300 ps, which is an order of magnitude below that of an ECL design of eight 8-bit carry look-ahead sections. The transistor count is also an order of magnitude smaller and consequently the power would be considersections. The transistor count is also an order of magnitude smaller and consequently the power would be considerably decreased. The designs based on conventional devices are equally promising for reducing the complexity of the adders and multipliers, and increasing the computational speed.

What is claimed is:

1. A carry signal generating device for generating a carry signal, said carry signal generating device has three inputs, said carry signal generating device further comprising:

means for setting a predetermined load line;

a carry signal indicator, including at least three negative differential resistance devices, for identifying said three inputs, wherein each of said at least three negative differential resistance devices has a control terminal to receive one of said inputs and an output terminal to provide an output in response to an input at said control terminal; and a common output terminal for generating said carry signal, said common output terminal being coupled to each of said output terminal of said three negative differential resistance devices and said load line setting means.

2. The device of claim 1, wherein said three negative differential resistance devices are negative differential resistance transistors.

3. A device for inverting an input having a first logical state and a second logical state, comprising:

means for setting a predetermined load line; and a logical state indicator, including a first negative differential resistance device and a second negative differential resistance device, wherein each of said first and second negative differential resistance devices has an input terminal and output terminal with said input terminal of said first negative differential resistance device being coupled to a predetermined voltage level and said second input terminal of said second device receiving said input; and a common output terminal for generating a logic inversion of said input, said common output terminal being coupled to each output of said two negative differential resistance devices and said load line setting means.

4. The device of claim 3, wherein said first and second devices are negative differential resistance transistors.

5. A device for generating a logical output in response to at least two inputs, comprising:

means for setting a predetermined load line;

a logical state indicator, including at least two negative differential resistance devices, for identifying said at least two inputs, wherein each of said at least two negative differential resistance devices has a control terminal to receive one of said at least two inputs and an output terminal to provide an output in response to an input at said control terminal; and a common output terminal for generating said logic output, said common output terminal being coupled to each output of said at least two negative differential resistance devices and said load line setting means.

6. The device of claim 5, wherein said at least two negative differential resistance devices are negative differential resistance transistors.

7. The device of claim 5, wherein said logical output is OR, AND, CARRY or SUM logical output.

8. The device of claim 5; wherein said logical output is NOR, NAND, complement of CARRY or complement of SUM logical output.

9. A sum signal generating device for generating a sum signal, said sum signal generating device has five inputs, said sum signal generating device further comprising:

means for setting a predetermined load line;

a sum signal indicator, including five negative differential devices, for identifying said five inputs, each of said five negative differential resistance devices has a control terminal to receive one of said five inputs and an output terminal to provide an output in response to an input of said control terminal; and a common output terminal for generating said sum signal, wherein said common output terminal is coupled to each of five outputs of said five negative differential resistance devices and said load line setting means.

10. The device of claim 9, wherein said output terminal of each of said five negative differential resistance devices provides a conducting current in response to a first logic state of an input at said control terminal; and wherein said common output terminal is coupled to output terminals of said five negative differential resistance devices and said load line setting means, so that said common output terminal generates different magnitudes of conducting currents according to negative differential resistance I-V characteristic current curves in response to a different number of said first logic state inputs at said five control terminals, whereby an operating point voltage at said common output terminal is determined by one of said several negative differential resistance I-V characteristic current curves selected by said load line setting means in response to a number of said first logic state inputs at said five control terminals, whereby sum signal is generated by properly setting conducting current for each of said five negative differential resistance devices in terms of their negative differential resistance I-V characteristics and by properly setting said load line.

11. The sum signal generating device of claim 10, wherein said voltage at said common output terminal is original state of a sum signal.

12. The sum signal generating device of claim 10, wherein said five negative differential resistance devices are negative differential resistance transistors.

13. The device of claim 12, wherein five bases of said five negative differential resistance transistors are coupled to ground, each of five collectors of said five negative differential resistance transistors is used to receive one of said five inputs and five emitters of said five negative differential resistance transistors are coupled to said common output terminal and a first end of said load line setting means to produce the said sum signal at the said common output terminal, and wherein a second end of said load line setting means is coupled to a constant voltage level.

14. The device of claim 9, wherein said voltage at said common output terminal is a complement of said sum signal.

15. The sum signal generating device of claim 14, wherein said five negative differential resistance devices are negative differential resistance transistors.

16. The sum signal generating device of claim 15, wherein five emitters of said five negative differential resistance transistors are coupled to ground, each of five bases of said five negative differential resistance transistors is used to receive one of said five inputs and five collectors of said five negative differential resistance transistors are coupled to said common output terminal and to a first end of said load line setting means, a second end of the said load line setting means is coupled to a voltage supply, to produce a complement of said sum signal at the said common output terminal.

17. The sum signal generating device of claim 14, wherein each of said five inputs has a first logical state and a second logical state, and wherein said complement of sum signal is in a first logic state when less than three of said five inputs are in the first logical state and said complement of sum signal is in a second logical state when at least three of said five inputs are in the first logical state, said sum signal generating device further comprising:
 a converting means for converting said complement of sum signal into said first logical state when said complement of sum signal is in said second logical state and converting said complement of sum signal into said second logical state when said complement of sum signal is in said first logical state, thereby producing the said sum signal.

18. The sum signal generating device of claim 17, wherein said converting means comprising:
 means for setting a predetermined load line; and
 a logical state indicator, including a first negative differential resistance device and a second negative differential resistance device, wherein each of said first and second negative differential resistance devices has an input terminal and output terminal with said first input terminal being coupled to a predetermined voltage level and said second input terminal receiving said complement of sum signal; and
 a common output terminal for inverting said complement of said sum signal, said common output terminal being coupled to each of two output terminals of said first and second negative differential resistance devices and load line setting means.

19. The device of claim 17, wherein said first and second negative differential resistance devices are negative differential resistance transistors.

20. The device of claim 19, wherein base of said first negative differential resistance transistor is coupled to said predetermined voltage level, base of said second negative differential resistance transistor receives said complement of sum signal, two emitters of said first and second negative differential resistance transistors are coupled to ground and two collectors of said first and second negative differential resistance transistors are coupled to said common output terminal and said load line setting means.

21. A device for generating a carry signal, said carry signal generating device has three inputs, said carry signal generating device further comprising:
 means for setting a predetermined load line;
 a carry signal indicator, including at least three negative differential resistance devices, for identifying said at least three inputs, wherein each of said at least three negative differential resistance devices has a control terminal to receive one of said inputs and an output terminal to provide a conducting current in response to a first logic state input at said control terminal; and
 a common output terminal coupled to each of at least three output terminals of said at least three negative differential resistance devices and said load line setting means, so that said common output terminal generates different magnitudes of conducting currents according to negative differential resistance I-V characteristic current curves in response to different numbers of said first logical state inputs at said at least three control terminals, whereby an operating point voltage at said common output terminal is determined by one of said negative differential resistance I-V characteristic current curves selected by said load line setting means in response to a number of said first logical state inputs at said at least three control terminals, whereby said carry signal is generated by properly setting conducting current magnitude for each of at least three said negative differential resistance devices in terms of their negative differential resistance I-V characteristics and by properly setting said load line.

22. The device of claim 21, wherein said three negative differential resistance devices are negative differential resistance transistors.

23. The device of claim 22, wherein three bases of said three negative differential resistance transistors are coupled to ground, each of three collectors of said three negative differential resistance transistors is used to receive one of said three inputs, and three emitter of said three negative differential resistance transistors are coupled to said common output terminal and load line setting means.

24. The device of claim 22, wherein three emitters of said three negative differential resistance transistors are coupled to ground, each of three bases of said three negative differential resistance transistors are used to receive one of said three inputs and three collectors of said three negative differential resistance transistors are coupled to said common output terminal and load line setting means.

25. The device of claim 21, wherein said three inputs has a first logical state and a second logical state, and wherein said carry signal is in a first logical state when less than two of said three inputs are in first logical state and said carry signal is in second logical state when at least two of said three inputs are in first logical state, said carry signal generating device further comprising:
 a converting means for converting said carry signal into a first logical state when said carry signal is in said second logical state and converting said carry signal into a second logical state when said carry signal is in said first logical state.

26. The device of claim 25, wherein said converting means comprises:
 means for setting a predetermined load line;
 a logical state indicator, including a first negative differential resistance device and a second negative differential resistance device, wherein each of said first negative differential resistance device and said second negative differential resistance device has an input terminal and output terminal with said first input terminal being coupled to a predetermined voltage level representing first logic state and said second input terminal receiving said carry signal, wherein each of said output terminals provides a conducting current in response to a first logic state input; and
 a common output terminal coupled to each of two output terminals of the first and second negative differential resistance devices and said load line setting means, so that said common output terminal generates two different magnitudes of conducting currents according to negative differential resistance I-V characteristic current curves in response to said first logical state and second logical state of said carry signal, whereby inverted first logic state at said common output terminal is determined by one of said two negative differential resistance I-V characteristic current curves selected by said load line setting means in response to said first logic state of said carry signal, and inverted second logic state at said common output terminal is determined by another one of said two negative differential resistance I-V characteristic current curves selected by said load line setting means in response to said second logic state of said carry signal, whereby said inverted logical state of said carry signal is generated by properly setting conducting current magnitudes of said first and second negative differential resistance devices in terms of their negative differential resistance I-V characteristic current curves and by properly setting said load line.

27. The device of claim 26, wherein said first and second transistors are negative differential resistance transistors.

28. The device of claim 27, wherein base of said first negative differential resistance transistor is coupled to said predetermined voltage level, base of said second negative differential resistance transistor receives said carry signal, two emitters of said first and second negative differential resistance transistors are coupled to ground, and two collectors of said first and second negative differential resistance transistors are coupled to said common output terminal and said load line setting means.

29. A device for inverting an input having a first logical state and a second logical state, comprising:
    means for setting a predetermined load line; and
    a logical state indicator, including a first negative differential resistance device and a second negative differential resistance device, each of said first negative differential resistance device and second negative differential resistance device has an input terminal and output terminal with said first input terminal being coupled to a predetermined voltage level representing said first logic state and said second input terminal receiving said input, wherein each of output terminals provides a conducting current in response to a first logic state input; and
    a common output terminal coupled to each of two output terminals of the first and second negative differential resistance devices and said load line setting means, so that said common output terminal generates two different magnitudes of conducting currents according to negative differential resistance I-V characteristic current curves in response to said first logical state and second logical state of said input, whereby inverted first logic state of said input at said common output terminal is determined by one of said negative differential resistance I-V characteristic current curves in response to said first logical state of said input, selected by said load line setting means, and inverted second logic state of said input at said common output terminal is determined by another one of said negative differential resistance I-V characteristic current curves selected by said load line setting means in response to said second logical state of said input, whereby said inverted logical state of said input is generated by properly setting conducting current magnitudes for said first and second negative differential resistance devices in terms of their negative differential resistance I-V characteristic current curves and by properly setting said load line.

30. The device of claim 29, wherein said first and second negative differential resistance devices are negative differential resistance transistors.

31. The device of claim 30, wherein base of said first negative differential resistance transistor is coupled to said predetermined voltage level, base of said second negative differential resistance transistor receives said input, two emitters of said first and second negative differential resistance transistors are coupled to ground and two collectors of said first and second negative differential resistance transistors are coupled to said common output terminal and said load setting means.

32. A device for generating a logical output in response to at least two inputs, comprising:
    means for setting a predetermined load line;
    a logical output indicator, including at least two negative differential resistance devices, for identifying said at least two inputs, wherein each of said at least two negative differential resistance devices has a control terminal to receive one of said at least two inputs and an output terminal to provide a conducting current in response to a first logic state input at said control terminal; and
    a common output terminal coupled to each of output terminals of said at least two negative differential resistance devices and said load line setting means, so that said common output terminal generates different magnitudes of conducting currents according to negative differential resistance I-V characteristic current curves in response to a different number of said first logic state inputs at said at least two control terminals, whereby an operating point voltage at said common output terminal is determined by one of said negative differential resistance I-V characteristic current curves selected by said load line setting means in response to a number of said first logic state inputs at said at least two control terminals, whereby different desired logical outputs are generated by properly setting conducting current for each of said at least two negative differential resistance devices in terms of their negative differential resistance I-V characteristics and by properly setting said load line.

33. The device of claim 32, wherein said at least two negative differential resistance devices are negative differential resistance transistors.

34. The device of claim 32, wherein said at least two negative differential resistance devices are at least two negative differential resistance transistors, and wherein bases of said at least two negative differential resistance transistors are coupled to ground, each collector of said at least two negative differential resistance transistors is used to receive one of said at least two inputs and emitters of said at least two negative differential resistance transistors are coupled to said common output terminal and said load line setting means.

35. The device of claim 32, wherein said at least two negative differential resistance devices are at least two negative differential resistance transistors, wherein emitters of said at least two negative differential resistance transistors are coupled to ground, each base of said at least two negative differential resistance transistors is used to receive one of said at least two inputs and collectors of said at least two negative differential resistance transistors are coupled to said common output terminal and said load line setting means.

36. The device of claim 32, wherein said logical output in NOR, NAND, complement of CARRY or complement of SUM logical output.

37. The device of claim 32, wherein said logical output is OR, AND, CARRY or SUM logical input.

38. A device for generating a logical output in response to at least two inputs, comprising:
a means for setting a predetermined load line;
an output indicator, including a negative differential resistance device having a control terminal to receive said at least two inputs and an output terminal to provide an output in response to said at least two inputs of said control terminal; and
wherein said output terminal is coupled to said load line setting means, so that said output terminal shifts the peak of negative differential resistance I-V characteristic current curve in response to a number of said first logic state inputs at said at least two inputs, whereby an operating point voltage at said common output terminal is determined by said peak shifted negative differential resistance I-V characteristic current curve selected by said load line setting means in response to a number of first logic state at said at least two control terminals, whereby different desired logical outputs are generated by properly setting peak shifting of said negative differential resistance I-V characteristic and by properly setting said load line.

39. The device of claim 38, wherein said negative differential resistance device is a negative differential resistance transistor.

40. The device of claim 39, wherein said logical output generating device further comprising at least two resistance means for receiving said at least two inputs, wherein base of said negative differential resistance transistor is coupled to said at least two resistance means, emitter of said negative differential resistance transistor is coupled to said common output terminal and said load line setting means, and collector of said negative differential resistance transistor is coupled to ground.

41. The device of claim 38, wherein said logical output is NOR, NAND or complement of CARRY logical output.

42. The device of claim 38, wherein said logical output is OR, AND or CARRY logical output.

43. The device of claim 38, wherein said logical output is complement of CARRY logical output.

* * * * *